(12) United States Patent
Ichihara et al.

(10) Patent No.: US 12,470,226 B2
(45) Date of Patent: Nov. 11, 2025

(54) SIGNAL PROCESSING SYSTEM, SIGNAL PROCESSING METHOD, AND NON-TRANSITORY COMPUTER READABLE MEDIUM

(71) Applicant: Asahi Kasei Microdevices Corporation, Tokyo (JP)

(72) Inventors: Eizo Ichihara, Tokyo (JP); Yusuke Kai, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 122 days.

(21) Appl. No.: 18/424,842

(22) Filed: Jan. 28, 2024

(65) Prior Publication Data

US 2024/0171187 A1 May 23, 2024

Related U.S. Application Data

(63) Continuation of application No. PCT/JP2022/027331, filed on Jul. 11, 2022.

(30) Foreign Application Priority Data

Sep. 6, 2021 (JP) .................. 2021-145058
Sep. 30, 2021 (JP) .................. 2021-160654

(51) Int. Cl.
*H03M 1/06* (2006.01)
*H03M 1/12* (2006.01)

(52) U.S. Cl.
CPC ........... *H03M 1/0629* (2013.01); *H03M 1/12* (2013.01)

(58) Field of Classification Search
CPC ...... G10K 11/178; H03H 17/00; H03H 17/06; H03H 21/00; H03M 1/0629; H03M 1/12
See application file for complete search history.

(56) References Cited

U.S. PATENT DOCUMENTS 6,260,053 B1 * 7/2001 Maulik .................. H03H 17/06
708/319
6,317,765 B1 * 11/2001 Page .................. H03H 17/0282
708/316

(Continued)

FOREIGN PATENT DOCUMENTS

JP     S63232587 A    9/1988
JP     H01235490 A    9/1989

(Continued)

OTHER PUBLICATIONS

International Search Report and Written Opinion (ISA/237) of the International Search Authority for International Patent Application No. PCT/JP2022/027332, mailed by the Japan Patent Office on Oct. 11, 2022.

(Continued)

*Primary Examiner* — Omer S Khan

(57) ABSTRACT

Provided is a signal processing system including: an adaptive decimation filter apparatus which has a decimation filter which outputs an output signal obtained by down-sampling an input signal, and an aliasing noise detection unit which detects a magnitude of aliasing noise, which is folded back to a frequency lower than a Nyquist frequency in the output signal of the decimation filter by the down-sampling; and a signal processing apparatus which has a filter control unit which adjusts an order of the decimation filter on the basis of the magnitude of the aliasing noise, and an adaptive filter unit which performs filter processing on the output signal of the decimation filter.

15 Claims, 36 Drawing Sheets

(56) References Cited

U.S. PATENT DOCUMENTS

| | | | |
|---|---|---|---|
| 8,718,289 B2 | 5/2014 | Shridhar | |
| 9,082,392 B2 | 7/2015 | Murthy | |
| 9,742,430 B1* | 8/2017 | Barrenscheen | H03M 3/462 |
| 2009/0066549 A1* | 3/2009 | Thomsen | H03M 3/484 |
| | | | 341/143 |
| 2009/0135035 A1 | 5/2009 | Fifield | |
| 2010/0086026 A1* | 4/2010 | Paniconi | G06T 3/4023 |
| | | | 375/E7.243 |
| 2010/0316226 A1 | 12/2010 | Yoneda | |

FOREIGN PATENT DOCUMENTS

| | | |
|---|---|---|
| JP | H09116472 A | 5/1997 |
| JP | 2000092141 A | 3/2000 |
| JP | 2001022383 A | 1/2001 |
| JP | 2010161635 A | 7/2010 |
| JP | 2012165203 A | 8/2012 |

OTHER PUBLICATIONS

International Search Report and Written Opinion (ISA/237) of the International Search Authority for International Patent Application No. PCT/JP2022/027331, mailed by the Japan Patent Office on Oct. 11, 2022.
International Search Report and Written Opinion (ISA/237) of the International Search Authority for International Patent Application No. PCT/JP2022/027330, mailed by the Japan Patent Office on Oct. 4, 2022.

* cited by examiner

| LEVEL CODE | FILTER CODE |
|---|---|
| LEVEL CODE > 0.5 | FILTER 1 (ATTENUATION AMOUNT OF ADJUSTMENT TARGET COMPONENT = 60 dB) |
| LEVEL CODE ≦ 0.5 | FILTER 2 (ATTENUATION AMOUNT OF ADJUSTMENT TARGET COMPONENT = 20 dB) |

FIG.9

| FN1 | FN0 | DESCRIPTION |
|---|---|---|
| 0 | 0 | FILTER MODE 1, DELAY TIME = 4[1/fs]<br>NOISE LEVEL > -100 dBFS |
| 0 | 1 | FILTER MODE 2, DELAY TIME = 6[1/fs]<br>NOISE LEVEL > -100 dBFS |
| 1 | 0 | FILTER MODE 1, DELAY TIME = 4[1/fs]<br>NOISE LEVEL <= -100 dBFS |
| 1 | 1 | FILTER MODE 2, DELAY TIME = 6[1/fs]<br>NOISE LEVEL <= -100 dBFS |

FIG.21

SIGNAL PROCESSING SYSTEM, SIGNAL PROCESSING METHOD, AND NON-TRANSITORY COMPUTER READABLE MEDIUM

The contents of the following patent application(s) are incorporated herein by reference:
NO. 2021-160654 filed in JP on Sep. 30, 2021
NO. 2021-145058 filed in JP on Sep. 6, 2021
NO. PCT/JP2022/027331 filed in WO on Jul. 11, 2022

BACKGROUND

1. Technical Field

The present invention relates to a signal processing system, a signal processing method, and a non-transitory computer readable medium.

2. Related Art

Patent Document 1 discloses a scalable finite impulse response (FIR) filter architecture. Patent Document 1 describes that the filter architecture is scalable to accommodate different complexity levels and that a filter can be scaled up/down by adding/subtracting a processing block to/from the existing structure (column 3, lines 39 to 53).

Patent Document 2 discloses an active noise canceller that performs feedforward and feedback control (column 2, lines 6 to 20). The active noise canceller of Patent Document 2 minimizes latency by operating at an oversampling data rate (384 KHz) without using a decimation filter (column 2, lines 21 to 53).

Patent Document 3 discloses an active noise control (ANC) system 300. The ANC system 300 generates an anti-noise signal 324 from the signals 316 and 338 detected by the sensor 314, which may be an accelerometer or vibration monitor configured to generate a signal based on the engine noise, and the microphone 336 which detects sound waves in or near the target space 310 (column 5, line 25 to column 6, line 41).

Patent Document 4 describes that "In the acoustic field, motional feedback (MFB) has been known. MFB is a technology for controlling, for example, the diaphragm of a speaker unit and an input audio signal to have the same movement by detecting the movement of the diaphragm of the speaker unit and applying negative feedback to the input audio signal." (paragraph 0002) and "according to the present application, a reproduced sound having a different hearing pattern can be selected based on whether or not the MFB is applied, for example, by changing the combination of the feedback methods to be turned on. In addition, accordingly, the frequency characteristic of the reproduced sound is appropriately corrected in accordance with the combination of the feedback methods to be turned on. In other words, by combining the feedback methods to be turned on, a frequency characteristic that is optimal can be acquired, and thereby the sound quality of the reproduced sound is maintained to be excellent." (paragraph 0007). PRIOR ART DOCUMENTS

PATENT DOCUMENT

Patent Document 1: Specification of U.S. Pat. No. 6,260,053
Patent Document 2: Specification of U.S. Pat. No. 9,082,392
Patent Document 3: Specification of U.S. Pat. No. 8,718,289
Patent Document 4: Japanese Patent No. 5321263

BRIEF DESCRIPTION OF THE DRAWINGS

FIG. 9 shows an operation of a filter characteristic determination unit 660 according to the present embodiment.

FIG. 21 shows an example of filter/noise level information according to the sixth modification of the present embodiment.

DESCRIPTION OF EXEMPLARY EMBODIMENTS

Hereinafter, the present invention will be described through embodiments of the invention, but the following embodiments do not limit the invention according to claims. In addition, not all of the combinations of features described in the embodiments are essential to the solution of the invention.

Figure 1:
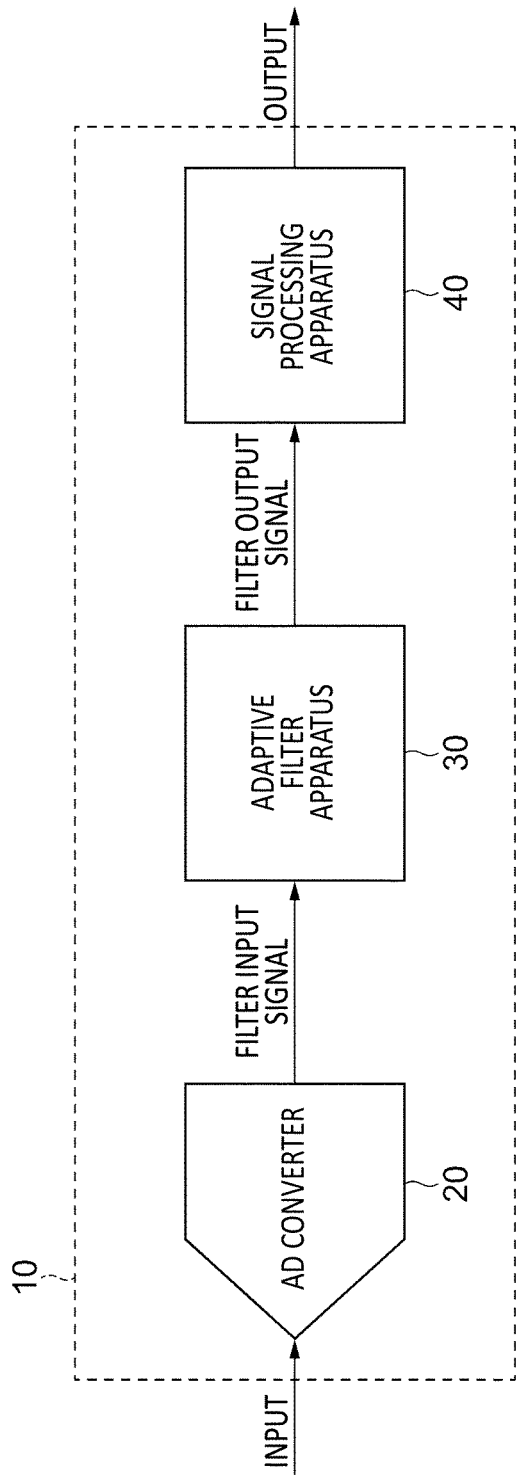
FIG. 1 shows a configuration of a signal processing system 10 according to the present embodiment.

FIG. 1 shows a configuration of a signal processing system 10 according to the present embodiment. The signal processing system 10 inputs an analog signal, performs signal processing, and outputs the result of the signal processing. As an example, the signal processing system 10 is a noise canceller that inputs an analog signal corresponding to noise reaching an audio listener or the like, vibration of a noise generation source, or the like, performs signal processing, and outputs a noise canceling signal for suppressing the noise. Alternatively, the signal processing system 10 may be an apparatus that inputs an analog signal and performs arbitrary signal processing.

The signal processing system 10 includes an analog-digital (AD) converter 20, an adaptive filter apparatus 30, and a signal processing apparatus 40. The AD converter 20 converts an analog input signal into a digital signal for each AD conversion cycle corresponding to an AD conversion frequency. The AD converter 20 outputs, as a filter input signal to the adaptive filter apparatus 30, the input signal converted into digital format.

The adaptive filter apparatus 30 is connected to the AD converter 20. The adaptive filter apparatus 30 inputs the filter input signal, performs filter processing, and outputs the filter input signal as a filter output signal. Here, the adaptive filter apparatus 30 performs adaptive filter processing of changing the characteristic of the filter processing according to the characteristic of the filter input signal.

The signal processing apparatus 40 is connected to the adaptive filter apparatus 30. The signal processing apparatus 40 receives the filter output signal from the adaptive filter apparatus 30. The signal processing apparatus 40 performs signal processing on the filter output signal and outputs the result of the signal processing. The signal processing apparatus 40 may be a processor for signal processing such as a digital signal processor (DSP) or a computer including a microcontroller. In addition, the signal processing apparatus 40 may be a computer such as a personal computer (PC), a tablet computer, a smartphone, a workstation, a server computer, or a general-purpose computer, or may be a computer system in which a plurality of computers are connected. Such a computer system is also a computer in a broad sense. The signal processing apparatus 40 executes a signal processing program on such a computer to perform signal processing on the filter output signal.

Figure 2:
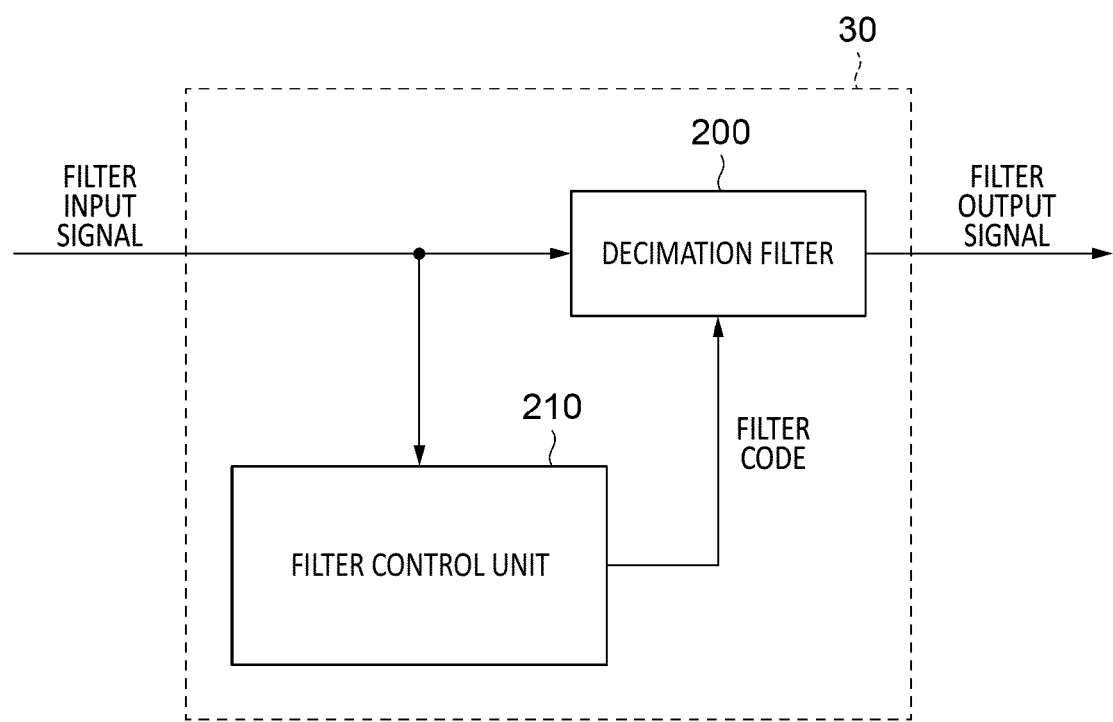
FIG. 2 shows a configuration of an adaptive filter apparatus 30 according to the present embodiment.

FIG. 2 shows a configuration of the adaptive filter apparatus 30 according to the present embodiment. The adaptive filter apparatus 30 down-samples the filter input signal and outputs the result as the filter output signal. Hereinafter, for convenience of description, the filter input signal is abbreviated as an "input signal", and the filter output signal is abbreviated as an "output signal". The adaptive filter apparatus 30 includes a decimation filter 200 and a filter control unit 210.

The decimation filter 200 outputs an output signal obtained by down-sampling the input signal. The filter control unit 210 changes the characteristic of the decimation filter 200 on the basis of the characteristic of the input signal. More specifically, the filter control unit 210 determines the characteristic of filter processing to be applied to the input signal on the basis of the characteristic of the input signal, and outputs filter identification information for identifying the determined characteristic of the filter processing to the decimation filter 200. In the present embodiment, the filter control unit 210 outputs, as an example of the filter identification information, a filter code for identifying a filter characteristic to be applied to the input signal by a code.

In the present embodiment, the filter control unit 210 adjusts the order of the decimation filter 200 on the basis of the characteristic of the input signal. As a result, the filter control unit 210 adjusts the filter characteristic (a pass band, a stop band, the sharpness of a filter determined from the pass band and the stop band, the attenuation amount of the stop band, or the like) of the decimation filter 200 for an adjustment target component, in the input signal, which has at least a part of frequencies equal to or higher than the Nyquist frequency of the output signal. Here, the decimation filter 200 may set, as the adjustment target component, all of frequencies, which are equal to or higher than the Nyquist frequency of the output signal, in the input signal, or may set only a part of the frequencies as adjustment target component.

Figure 3:
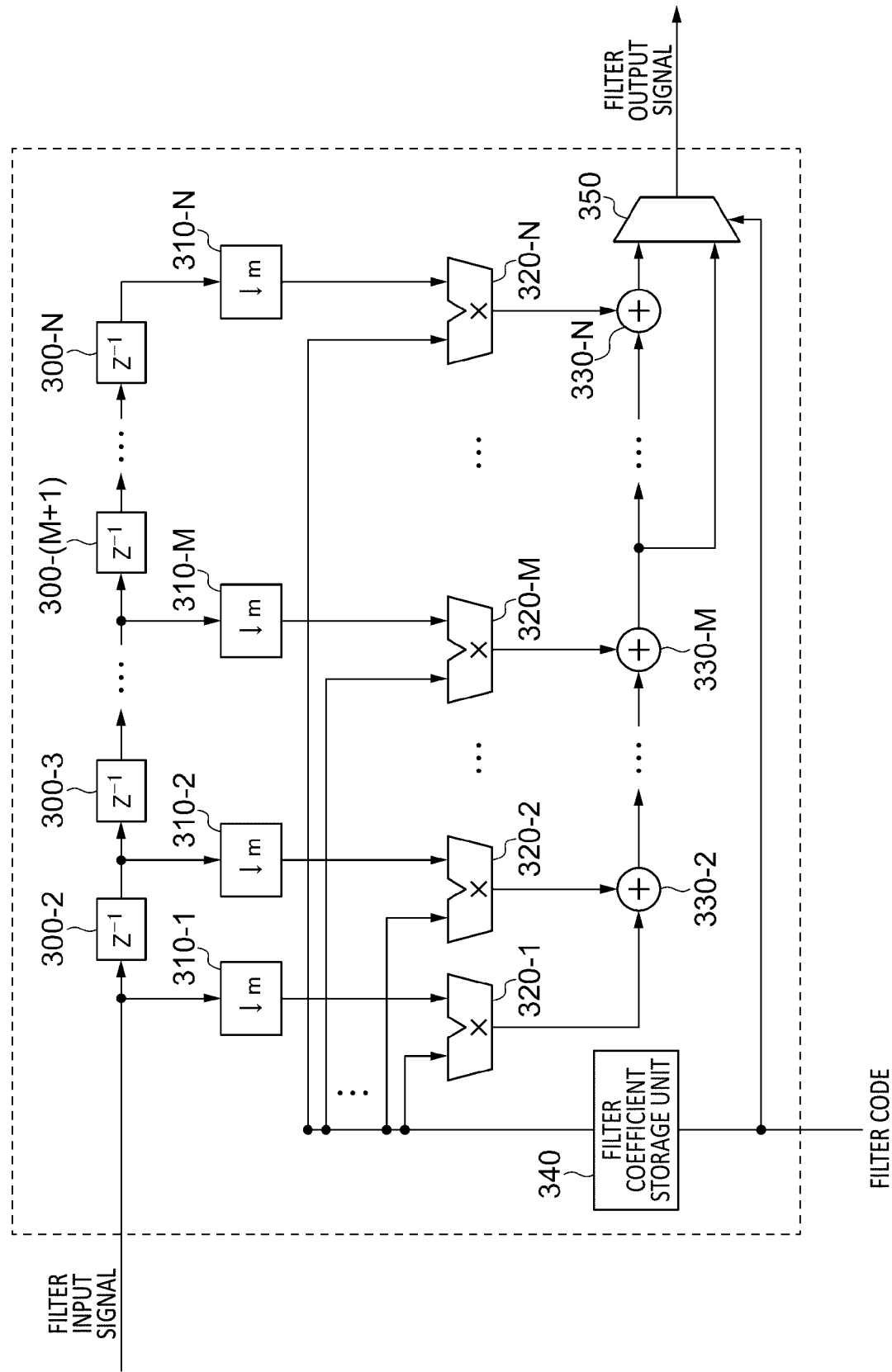
FIG. 3 shows a configuration of a decimation filter 200 according to the present embodiment.

FIG. 3 shows a configuration of the decimation filter 200 according to the present embodiment. The decimation filter 200 may be dedicated hardware realized by a dedicated circuit, or at least a part thereof may be realized by executing a filter program on a computer. In the present embodiment, the decimation filter 200 is a finite impulse response (FIR) filter as an example, but an infinite impulse response (IIR) filter can also be used. The decimation filter includes a plurality of delay elements 300-2 to N (N is an integer of 2 or more), a plurality of thinning elements 310-1 to N, a plurality of multipliers 320-1 to N, a plurality of adders 330-2 to N, a filter coefficient storage unit 340, and a selector 350.

The plurality of delay elements 300-2 to N (also referred to as a delay element 300) are connected in series in this order. The delay element 300-2 at the head receives an input signal for each AD conversion cycle, delays the input signal by one AD conversion cycle, and outputs the delayed input signal to the next delay element 300-3. Similarly, the delay elements 300-3 to N delay the received input signal by one AD conversion cycle and output the delayed input signal to the delay element 300 at the next stage.

The plurality of thinning elements 310-1 to N (also referred to as a thinning element 310) thins, to 1/m, the input signal output from the AD converter 20 and the delayed input signal output by each of the delay elements 300-2 to N. That is, the thinning element 310-1 thins the input signal output from the AD converter 20 and outputs the result. Each of the thinning elements 310-2 to N thins the delayed input signal output from the corresponding delay element 300 among the delay elements 300-2 to N and outputs the result. Here, each thinning element 310 thins the input signal by outputting the received input signal every m times of AD conversion cycles.

The plurality of multipliers 320-1 to N (also referred to as multipliers 320) multiplies each of the plurality of signals received from the plurality of thinning elements 310-1 to N by each of a plurality of filter coefficients received from the filter coefficient storage unit 340. The plurality of adders 330-2 to N supply the total value of the outputs of the plurality of multipliers 320-1 to N to the selector 350. In addition, the plurality of adders 330-2 to M (M is a positive integer smaller than N) supply the total value of the outputs of the plurality of multipliers 320-1 to M to the selector 350.

The filter coefficient storage unit 340 supplies the filter coefficients corresponding to the filter identification information (filter code) received from the filter control unit 210 to the plurality of multipliers 320-1 to N. In the present embodiment, when the filter code instructs to set a first filter characteristic, the filter coefficient storage unit 340 supplies a plurality of filter coefficients corresponding to the first filter characteristic to the plurality of multipliers 320-1 to N. In addition, when the filter code instructs to set a second filter characteristic, the filter coefficient storage unit 340 supplies a plurality of filter coefficients corresponding to the second filter characteristic to the plurality of multipliers 320-1 to N.

The selector 350 changes the order of the decimation filter 200 according to the filter identification information (filter code) received from the filter control unit 210. In the present embodiment, the selector 350 selects, as the output signal, the total value of the outputs of the plurality of multipliers 320-1 to N in response to receiving the filter code instructing to set the first filter characteristic. In addition, the selector 350 selects, as the output signal, the total value of the outputs of the plurality of multipliers 320-1 to M in response to receiving the filter code instructing to set the second filter characteristic. In this manner, in response to the second filter characteristic being set, the decimation filter 200 makes the order of the filter smaller than that in a case where the first filter characteristic is set. Accordingly, in response to the second filter characteristic being set, the decimation filter 200 shortens a delay time as compared with a case where the first filter characteristic is set.

Figure 4:
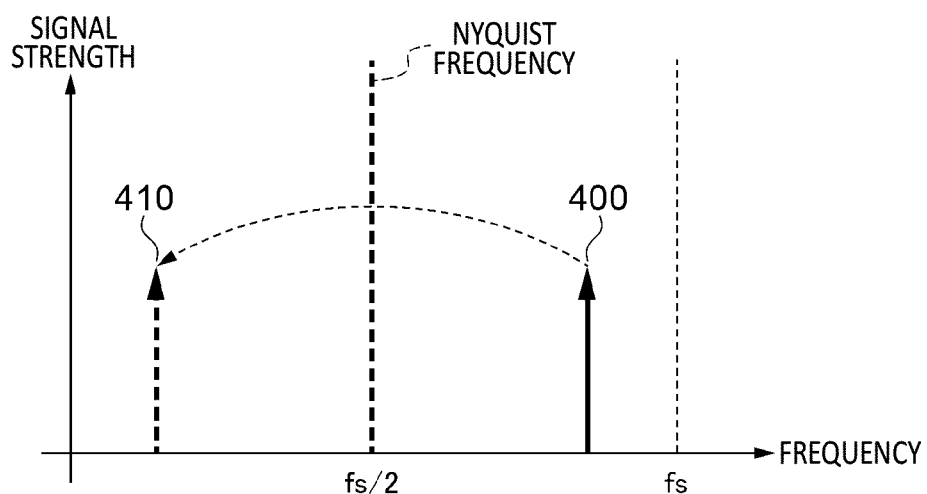
FIG. 4 shows an example of aliasing caused by down-sampling.

FIG. 4 shows an example of aliasing caused by down-sampling. This drawing shows aliasing occurring in the output signal of the decimation filter 200 by a graph having a frequency as a horizontal axis and a signal strength as a vertical axis.

In this drawing, "fs" indicates the frequency (sampling frequency) of the output signal output by the decimation filter 200. The frequency (AD conversion frequency) of the input signal supplied from the AD converter 20 to the decimation filter 200 is higher than the sampling frequency. The decimation filter 200 down-samples the input signal having the AD conversion frequency to lower the frequency, and outputs the result as the output signal having the sampling frequency. For example, in the case of noise canceling, the AD conversion frequency may be, for example, about 200 KHz, and the sampling frequency fs may be, for example, about 2 KHz.

Given that the sampling frequency of the output signal is fs, a Nyquist frequency fs/2 is one-half of the sampling frequency fs according to the sampling theorem, and the decimation filter 200 can output a signal component, which is equal to or lower than the Nyquist frequency fs/2, in the input signal in a reproducible manner. However, when the input signal is simply thinned by a thinning filter, due to aliasing, a signal component (for example, a signal 400 in the drawing) exceeding the Nyquist frequency fs/2 is folded back to a frequency region of the Nyquist frequency fs/2 or lower to be included as aliasing (for example, aliasing 410 in the drawing) in the output signal.

In this regard, when the input signal is down-sampled, in addition to the thinning of the input signal, low pass filtering is performed in which a frequency component, which is equal to or higher than a cutoff frequency, in the input signal is removed or attenuated, and a frequency component equal to or lower than the cutoff frequency are allowed to pass therethrough. Such down-sampling of the input signal is referred to as "decimation". Here, the cutoff frequency is usually the Nyquist frequency fs/2, but may be a frequency lower than the Nyquist frequency fs/2. Note that, theoretically, the decimation reduces the frequency of the output signal to the sampling frequency by performing the low pass filtering on the input signal at the frequency (that is, AD conversion frequency) of the input signal and then thinning. The decimation filter 200 shown in FIG. 3 has a configuration in which such decimation processing is equivalently transformed by noble identity transformation so that the thinning is performed first.

Figure 5:
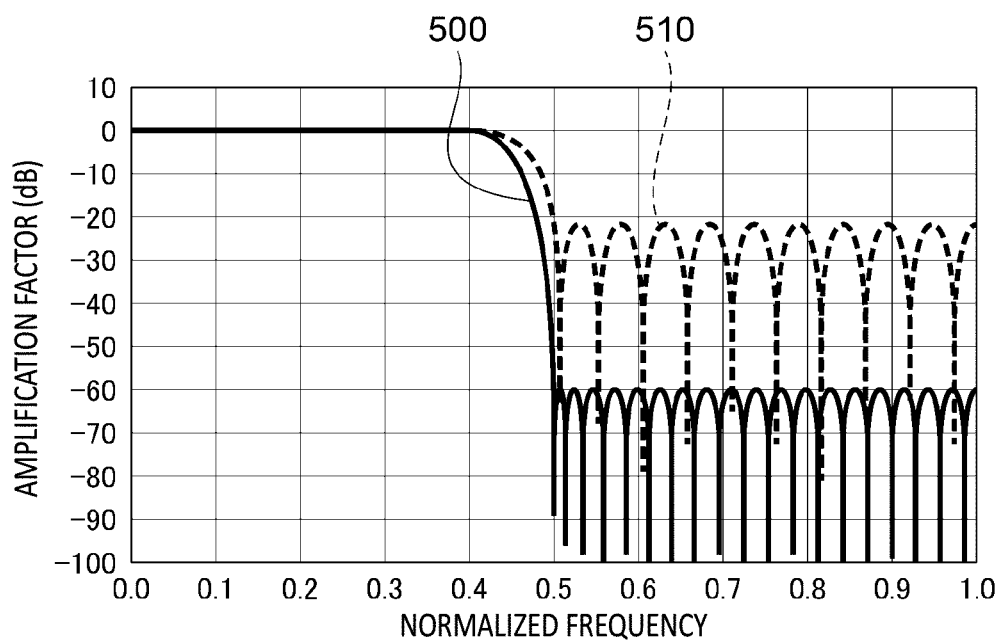
FIG. 5 shows an example of filter characteristics of a decimation filter 200 according to the present embodiment.

FIG. 5 shows an example of the filter characteristic of the decimation filter 200 according to the present embodiment. In this drawing, a horizontal axis represents the frequency obtained by normalizing the sampling frequency of the output signal to 1, and a vertical axis represents the amplification factor of the signal in decibels (dB).

The characteristic of the decimation filter 200 varies depending on the order of the decimation filter 200. In the decimation filter 200, the order is set to N when the first filter characteristic 500 is set, and the order is set to M smaller than N when the second filter characteristic 510 is set. When the first filter characteristic 500 is set, in the decimation filter 200, the order increases, so that a delay amount increases, but the attenuation amount of the adjustment target component, which is equal to or higher than the Nyquist frequency, in the input signal can be increased. When the second filter characteristic 510 is set, in the decimation filter 200, the order decreases, so that the delay amount can be reduced, but the attenuation amount of the adjustment target component, which is equal to or higher than the Nyquist frequency, in the input signal decreases, so that the adjustment target component easily remains in the output signal. As described above, the delay amount of the decimation filter 200 and the attenuation amount of the adjustment target component are in a trade-off relationship.

Here, the "attenuation amount" of the adjustment target component in the input signal indicates the reciprocal of the gain of the decimation filter 200 with respect to the adjustment target component. Since the gain of the adjustment target component equal to or higher than the Nyquist frequency is about −60 dB, the first filter characteristic 500 in this drawing has an attenuation amount of about 60 dB. In addition, since the gain of the adjustment target component equal to or higher than the Nyquist frequency is about −20 dB, the second filter characteristic 510 has an attenuation amount of about 20 dB. Note that the attenuation amount of the adjustment target component may be an attenuation amount corresponding to the maximum gain, that is, the minimum attenuation amount within a frequency range including the adjustment target component.

Figure 6:
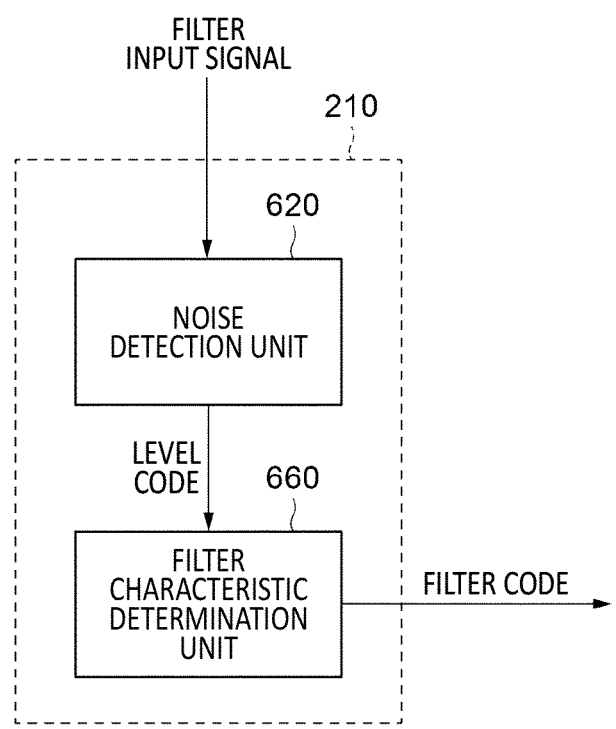
FIG. 6 shows a configuration of a filter control unit 210 according to the present embodiment.

FIG. 6 shows a configuration of the filter control unit 210 according to the present embodiment. The filter control unit 210 includes a noise detection unit 620 and a filter characteristic determination unit 660.

The noise detection unit 620 detects a signal level of at least a part of frequencies, which are equal to or higher than the Nyquist frequency, in the input signal. Here, a frequency component, which is detected by the noise detection unit 620 and has at least a part of frequencies equal to or higher than the Nyquist frequency, in the input signal is referred to as an "inspection target component". As shown in FIG. 4, the inspection target component can be noise superimposed on the output signal due to aliasing after the decimation by the decimation filter 200. The noise detection unit 620 outputs noise level information indicating the signal level (magnitude) of the inspection target component. In the present embodiment, the noise detection unit 620 outputs, as an example of the noise level information, a level code obtained by normalizing the signal level of the inspection target component to a value between 0 and 1.

The filter characteristic determination unit 660 is connected to the noise detection unit 620 and receives the level code as an example of the noise level information. The filter characteristic determination unit 660 determines a filter characteristic to be set to the decimation filter 200 on the basis of the signal level of the inspection target component detected by the noise detection unit 620. The filter characteristic determination unit 660 may adjust the order of the decimation filter 200 according to the signal level of the inspection target component. The filter characteristic determination unit 660 outputs a filter code as an example of filter identification information corresponding to the determined filter characteristic.

Figure 7:
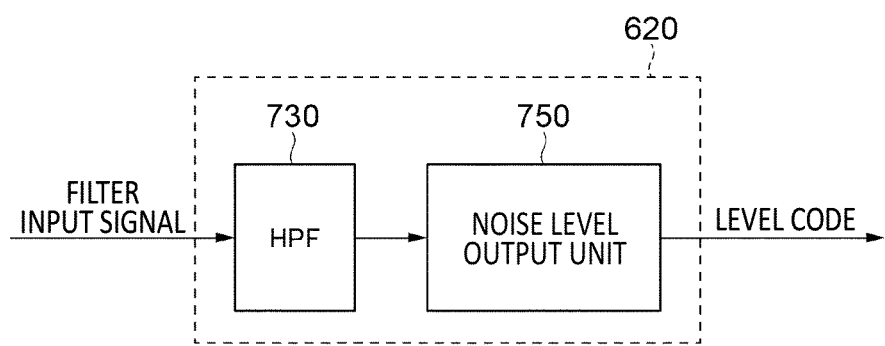
FIG. 7 shows a configuration of a noise detection unit 620 according to the present embodiment.

FIG. 7 shows a configuration of the noise detection unit 620 according to the present embodiment. The noise detection unit 620 includes a HPF 730 and a noise level output unit 750. The high pass filter (HPF) 730 attenuates a signal component of a frequency band, which is lower than the Nyquist frequency of the output signal, in the input signal, and allows the signal component of the frequency band equal to or higher than the Nyquist frequency of the output signal to pass therethrough. That is, the HPF 730 according to the present embodiment uses, as the inspection target component, the signal component in the frequency band equal to or higher than the Nyquist frequency of the output signal and allows the inspection target component to pass therethrough.

The noise level output unit 750 outputs the signal level of the signal output by the HPF 730 as the noise level information. For example, the noise level output unit 750 outputs a signal level corresponding to at least one of a peak value, an absolute value, an average value, an average value of peak values, or an average value of absolute values. Here, the noise level output unit 750 may calculate, as the peak value or the average value, a peak value or an average value, in a predetermined length of most recent period, of the signal output by the HPF 730.

Note that the frequency bands of the inspection target component and the adjustment target component may be appropriately determined according to the application of the adaptive filter apparatus 30. The frequency band of the adjustment target component and the frequency band of the inspection target component may be the same as each other, may be partially overlapped with each other, or may be different from each other. For example, the adaptive filter apparatus 30 may set the inspection target component as the signal component in the frequency band equal to or higher than the Nyquist frequency of the output signal, and may set the signal component in the same frequency band as the adjustment target component. In addition, the adaptive filter apparatus 30 may set a part of the inspection target component as the adjustment target component, or may set a signal component in a wider frequency band including the inspection target component as the adjustment target component. For example, the adaptive filter apparatus 30 may set, as the adjustment target component, only a part of the frequency band equal to or higher than the Nyquist frequency of the output signal while setting the inspection target component as the signal component of the entire frequency band equal to or higher than the Nyquist frequency of the output signal.

Figure 8:
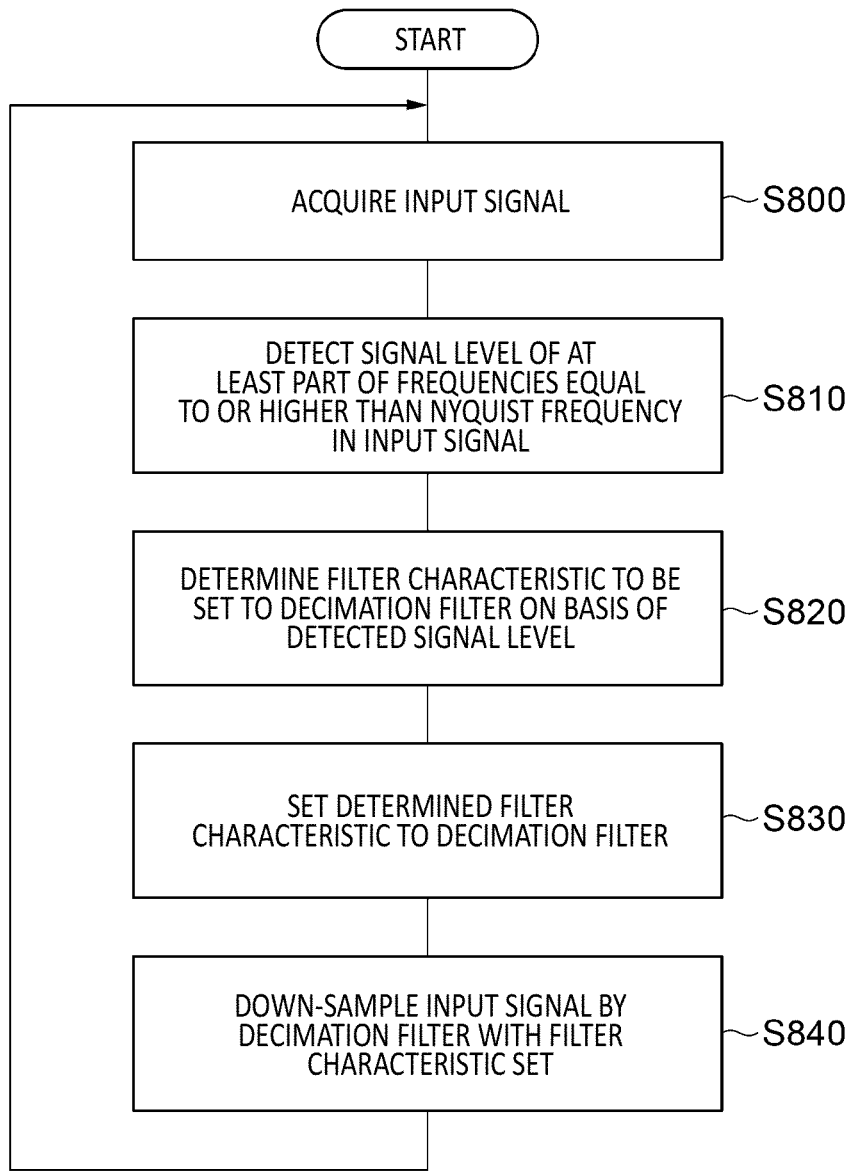
FIG. 8 shows an operation flow of the adaptive filter apparatus 30 according to the present embodiment.

FIG. 8 shows an operation flow of the adaptive filter apparatus 30 according to the present embodiment. In step S800, the adaptive filter apparatus 30 acquires an input signal (filter input signal) from the AD converter 20. In S810, the noise detection unit 620 in the filter control unit 210 detects the signal level of at least a part of frequencies, which are equal to or higher than the Nyquist frequency, in the input signal. Here, the HPF 730 in the noise detection unit 620 may attenuate a signal component of a frequency band, which is lower than the Nyquist frequency of the output signal, in the input signal, and the noise level output unit 750 in the noise detection unit 620 may output, as the noise level information, the signal level of the signal output by the HPF 730. Accordingly, the noise detection unit 620 can extract a noise component, which is folded back to a frequency region lower than the Nyquist frequency in the output signal, equal to or higher than the Nyquist frequency and measure the noise component as a noise level.

In S820, the filter characteristic determination unit 660 determines a filter characteristic to be set to the decimation filter 200 on the basis of the signal level of the inspection target component detected by the noise detection unit 620. When the signal level of the inspection target component is relatively large, the filter characteristic determination unit 660 may determine the filter characteristic so as to increase the order of the decimation filter 200. Accordingly, the filter characteristic determination unit 660 keeps the attenuation amount of the adjustment target component by the decimation filter 200 larger. In addition, when the signal level of the inspection target component is relatively small, the filter characteristic determination unit 660 may determine the filter characteristic so as to reduce the order of the decimation filter 200. Accordingly, the filter characteristic determination unit 660 can shorten the delay time of the decimation filter 200 instead of reducing the attenuation amount of the adjustment target component by the decimation filter 200.

The determination of the filter characteristic of the filter characteristic determination unit 660 with respect to the magnitude of the signal level of the inspection target component may be reversed. Specifically, the filter characteristic determination unit 660 may shorten the delay time of the decimation filter 200 by determining the filter characteristic so as to reduce the order of the decimation filter 200 when the signal level of the detection target component is relatively large, and may lengthen the delay time of the decimation filter 200 by determining the filter characteristic so as to increase the order of the decimation filter 200 when the signal level of the detection target component is relatively small.

Here, the adjustment target component may be a frequency component of all of frequencies equal to or higher than the Nyquist frequency. Alternatively, the adjustment target component may be a signal component in a partial frequency band equal to or higher than the Nyquist frequency. For example, the adjustment target component may be a signal component of a frequency band which is folded back to a frequency band (for example, a frequency band of 2,000 Hz to 4,000 Hz or the like at which sensitivity in human hearing is high) in which the influence of noise becomes significant when aliased below the Nyquist frequency.

In S830, the filter characteristic determination unit 660 sets the determined filter characteristic to the decimation filter 200. Accordingly, the filter characteristic determination unit 660 can adjust the order of the decimation filter 200 and the attenuation amount of the adjustment target component according to the signal level (noise level) of the inspection target component detected by the noise detection unit 620. When the level of noise which is folded back to a frequency lower than the Nyquist frequency is relatively large, the filter characteristic determination unit 660 can reduce the noise by further increasing the attenuation amount of the adjustment target component in the input signal. When the level of the noise which is folded back to the frequency lower than the Nyquist frequency is relatively small, the filter characteristic determination unit 660 further reduces the attenuation amount of the adjustment target component in the input signal to reduce the attenuation amount of the noise, and suppresses the filter strength of the decimation filter 200. Note that, in the control of the filter characteristic determination unit 660 with respect to the level of the noise which is folded back to the frequency lower than the Nyquist frequency, the relationship of the increase/decrease in the attenuation amount with respect to the magnitude of the level of the noise can be reversed.

Here, the filter characteristic determination unit 660 may detect a zero-cross timing at which the positive and negative of the filter input signal are switched, and change the filter characteristic according to the zero-cross timing. In addition, the filter characteristic determination unit 660 may change the filter characteristic of the decimation filter 200 stepwise from current filter characteristic to a target filter characteristic. Accordingly, the filter characteristic determination unit 660 can suppress the uncomfortable feeling generated in an audio signal such as the noise canceling signal generated according to the signal processing result of the output signal.

In S840, the adaptive filter apparatus 30 down-samples the input signal by the decimation filter 200 of which the filter characteristic are set by the filter characteristic determination unit 660. When the filter characteristic for further increasing the order of the filter is set, the decimation filter 200 realizes a target attenuation amount by further increasing the attenuation amount of the adjustment target component. When the filter characteristic for reducing the order of the filter is set, the decimation filter 200 can reduce the attenuation amount of the adjustment target component within a range of the target attenuation amount.

FIG. 9 shows an operation of the filter characteristic determination unit 660 according to the present embodiment. In the present embodiment, the filter characteristic determination unit 660 in the filter control unit 210 supplies a filter code for setting the first filter characteristic ("filter 1" in the drawing) or the second filter characteristic ("filter 2" in the drawing) to the decimation filter 200 according to the level code indicating the noise level information output by the noise detection unit 620.

When the noise level (the signal level of the inspection target component detected by the noise detection unit 620) is larger than a predetermined standard, the filter characteristic determination unit 660 sets the first filter characteristic to the decimation filter 200. In the example of this drawing, when the noise level output by the noise detection unit 620 is larger than 0.5, the filter characteristic determination unit 660 supplies, to the decimation filter 200, a filter code for setting, to the decimation filter 200, the first filter characteristic in which the attenuation amount of the adjustment target component is 60 dB (attenuation to $\frac{1}{1000}$). Accordingly, the decimation filter 200 shown in FIG. 3 is set to the first filter characteristic by the filter coefficient stored in the filter coefficient storage unit 340, and the order is N.

On the other hand, when the noise level is equal to or less than the standard, the filter characteristic determination unit 660 sets, to the decimation filter 200, the second filter characteristic in which the attenuation amount of the adjustment target component is smaller than that of the first filter characteristic. In the example of this drawing, when the noise level output by the noise detection unit 620 is smaller than 0.5, the filter characteristic determination unit 660 sets, to the decimation filter 200, the second filter characteristic in which the attenuation amount of the adjustment target component is 20 dB (attenuation to $\frac{1}{10}$). Accordingly, the decimation filter 200 shown in FIG. 3 is set to the second filter characteristic by the filter coefficient stored in the filter coefficient storage unit 340, and the order is M (M<N). Note that contrary to the setting of FIG. 9, the filter characteristic determination unit 660 may select the second filter characteristic having a small attenuation amount and a small delay amount when the noise level is larger than a standard value, and select the first filter characteristic having a large attenuation amount and a large delay amount when the noise level is smaller than the standard value.

According to the adaptive filter apparatus 30 described above, it is possible to adjust the order of the decimation filter 200 and the attenuation amount of the adjustment target component by changing the filter characteristic of the decimation filter 200 according to the signal level, which indicates the noise level, of the inspection target component in the input signal. Accordingly, when the noise level is low, the adaptive filter apparatus 30 can reduce the delay amount of the decimation filter 200 by reducing the attenuation amount of the adjustment target component. In this case, the adaptive filter apparatus 30 can supply the decimated input signal to the signal processing apparatus 40 in the subsequent stage more quickly, and can ensure a longer processing time of the signal processing apparatus 40 in signal processing in which real-time property such as noise canceling or distortion correction of vibration of a speaker is required, for example.

Conversely, when the noise level is high, the adaptive filter apparatus 30 can reduce the delay amount of the decimation filter 200 by reducing the attenuation amount of the adjustment target component. In this case, when the noise level is high, the adaptive filter apparatus 30 can supply the decimated input signal to the signal processing apparatus 40 in the subsequent stage more quickly, and can give a processing time sufficient for the signal processing apparatus 40 in the subsequent stage to generate a noise canceling signal having a phase difference of 180 degrees with respect to the input. In this case, when the noise level is low, the supply of the decimated input signal to the signal processing apparatus 40 in the subsequent stage is delayed, and a noise canceling performance by the signal processing apparatus 40 in the subsequent stage is deteriorated. Overall, the signal processing system 10 improves the noise canceling performance when the noise level is high, and deteriorates the noise canceling performance when the noise level is low, thereby reducing increase/decrease in noise due to an environmental change.

Note that the adaptive filter apparatus 30 according to the present embodiment adjusts the filter characteristic of the decimation filter 200 in two stages according to the noise level. Alternatively, the filter characteristic of the decimation filter 200 may be adjusted in three or more stages according to the noise level.

Figure 10:
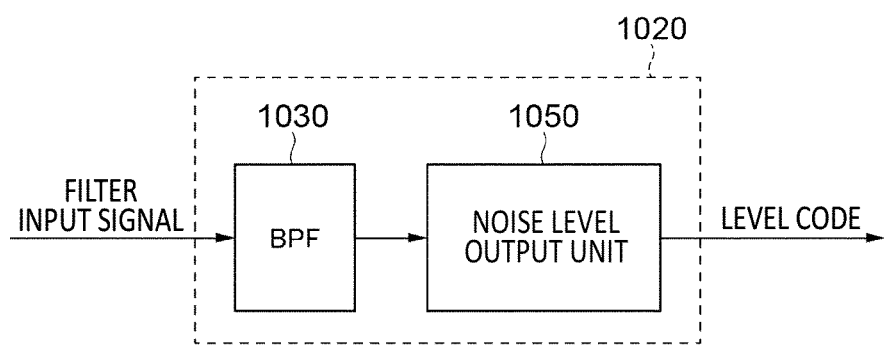
FIG. 10 shows a configuration of a noise detection unit 1020 according to a first modification of the present embodiment.

FIG. 10 shows a configuration of a noise detection unit 1020 according to a first modification of the present embodiment. In the present modification, the adaptive filter apparatus 30 has the noise detection unit 1020 instead of the noise detection unit 620. Since the functions and configurations of the other blocks in the adaptive filter apparatus 30 are the same as those shown in relation to FIGS. 1 to 9, the description thereof will be omitted except for the following differences.

The noise detection unit 1020 includes a BPF 1030 and a noise level output unit 1050. The band pass filter (BPF) 1030 attenuates a signal component other than a partial frequency band, which is equal to or higher than the Nyquist frequency, in the input signal, and allows the signal component of the partial frequency band to pass therethrough. That is, the BPF 1030 according to the present embodiment uses, as the inspection target component, the signal component of the partial frequency band equal to or higher than the Nyquist frequency of the output signal and allows the inspection target component to pass therethrough.

The noise level output unit 1050 outputs, as the noise level information, the signal level of the signal output by the BPF 1030. For example, the noise level output unit 1050 outputs a signal level corresponding to at least one of a peak value, an absolute value, an average value, an average value of peak values, or an average value of absolute values. Here, the noise level output unit 1050 may calculate, as the peak value or the average value, a peak value or an average value, in a predetermined length of most recent period, of the signal output by the BPF 1030.

In the present modification, the noise detection unit 1020 detects the noise level only in a signal component in a partial frequency band among signal components, which are equal to or higher than the Nyquist frequency, in the input signal. Accordingly, the noise detection unit 1020 can adjust the filter characteristic of the decimation filter 200 according to the noise level in a frequency band (for example, a frequency band in the vicinity of 1 KHz at which sensitivity in human hearing is high) in which the influence of noise becomes noticeable when folded back below the Nyquist frequency of the output signal.

The frequency bands of the inspection target component and the adjustment target component may be appropriately determined according to the application of the adaptive filter apparatus 30, and the frequency band of the adjustment target component and the frequency band of the inspection target component may be the same as each other, may be partially overlapped with each other, or may be different from each other. For example, the adaptive filter apparatus 30 may set the inspection target component as a signal component of only a partial frequency band equal to or higher than the Nyquist frequency of the output signal, and may set the signal component of the same frequency band as the adjustment target component. In addition, the adaptive filter apparatus 30 may set a part of the inspection target component as the adjustment target component, or may set a signal component in a wider frequency band including the inspection target component as the adjustment target component. For example, the adaptive filter apparatus 30 may set, as the adjustment target component, the entire frequency band equal to or higher than the Nyquist frequency of the output signal while setting the inspection target component as the signal component of only a partial frequency band equal to or higher than the Nyquist frequency of the output signal.

Figure 11:
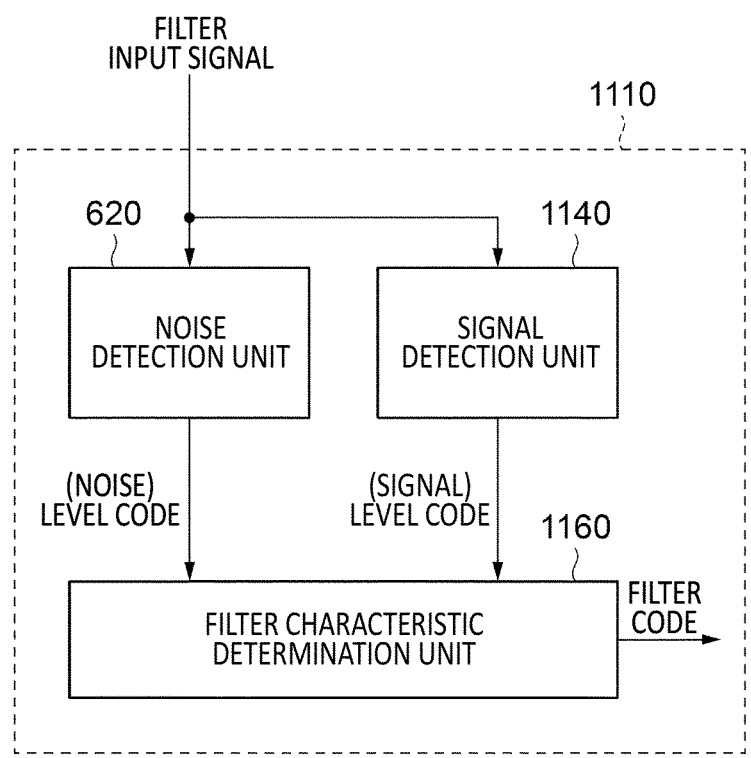
FIG. 11 shows a configuration of a filter control unit 1110 according to a second modification of the present embodiment.

FIG. 11 shows a configuration of a filter control unit 1110 according to a second modification of the present embodiment. The filter control unit 1110 is a modification of the filter control unit 210 shown in relation to FIG. 6. The blocks in the filter control unit 1110 having functions and configurations similar to those of the filter control unit 210 will be not described except for the following differences.

The filter control unit 1110 has the noise detection unit 620, a signal detection unit 1140, and a filter characteristic determination unit 1160. The noise detection unit 620 has a function and a configuration similar to those of the noise detection unit 620 in FIG. 6.

The signal detection unit 1140 detects an original signal component, which is a target of signal processing by the signal processing apparatus 40, in the input signal. More specifically, the signal detection unit 1140 detects a signal level of a signal component (hereinafter, also referred to as a "main signal") of at least a part of frequencies, which are lower than the Nyquist frequency, in the input signal.

The filter characteristic determination unit 1160 is connected to the noise detection unit 620 and the signal detection unit 1140. The filter characteristic determination unit 1160 determines a filter characteristic to be set to the decimation filter 200 on the basis of the signal level detected by the signal detection unit 1140 and the noise level detected by the noise detection unit 620.

Figure 12:
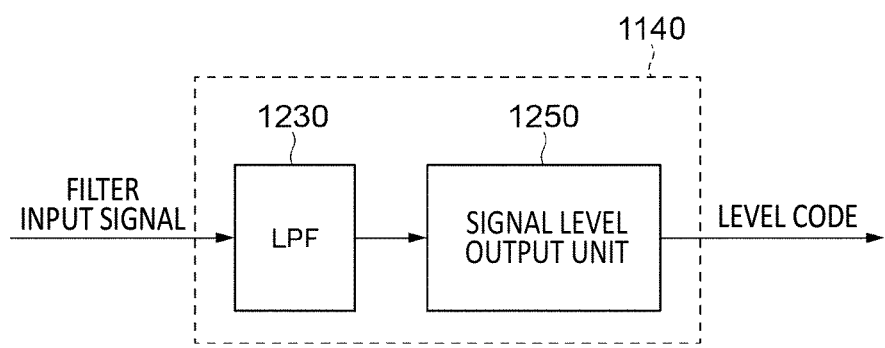
FIG. 12 shows a configuration of a signal detection unit 1140 according to the second modification of the present embodiment.

FIG. 12 shows a configuration of the signal detection unit 1140 according to the second modification of the present embodiment. The signal detection unit 1140 includes an LPF 1230 and a signal level output unit 1250.

The LPF 1230 attenuates a signal component of a frequency, which is equal to or higher than the Nyquist frequency, in the input signal, and allows a signal component of a frequency band lower than the Nyquist frequency of the output signal to pass therethrough. That is, the LPF 1230 according to the present embodiment regards, as the main signal by the signal processing apparatus 40, the signal component of the frequency band lower than the Nyquist frequency of the output signal, and allows the signal component of the main signal to passes therethrough.

The signal level output unit 1250 is connected to the LPF 1230. The signal level output unit 1250 outputs a signal level corresponding to the input signal having passed through the LPF 1230. The signal level output unit 1250 outputs a signal level code as an example of a signal level, which corresponds to at least one of a peak value, an absolute value, an average value, an average value of peak values, or an average value of absolute values, of the signal output by the LPF 1230.

Figure 13:
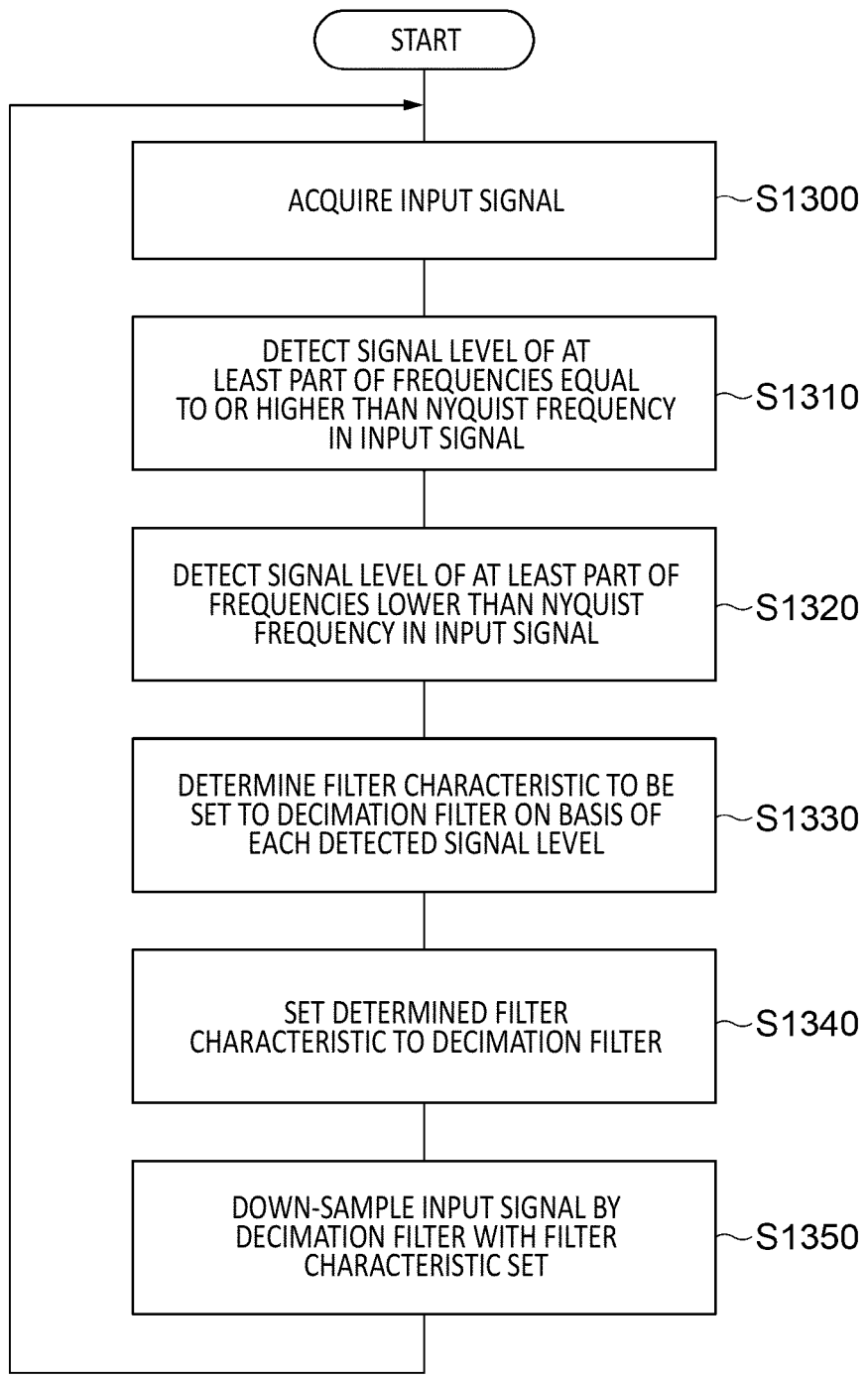
FIG. 13 shows an operation flow of the adaptive filter apparatus 30 according to the second modification of the present embodiment.

FIG. 13 shows an operation flow of the adaptive filter apparatus 30 according to the second modification of the present embodiment. Since the operation flow of this drawing is a modification of the operation flow shown in FIG. 8, the description thereof will be omitted except for the following differences.

S1300 and S1310 are similar to S800 and S810 in FIG. 8. In S1320, the signal detection unit 1140 in the filter control unit 1110 detects the signal level of at least a part of frequencies, which are lower than the Nyquist frequency, in the input signal.

In S1330, the filter characteristic determination unit 1160 determines a filter characteristic to be set to the decimation filter 200 on the basis of the signal level detected by the signal detection unit 1140 and the noise level detected by the noise detection unit 620. When the signal level detected by the signal detection unit 1140 is higher than the noise level detected by the noise detection unit 620, the filter characteristic determination unit 1160 may determine a filter characteristic for further reducing the order of the decimation filter 200 and the attenuation amount of the adjustment target component. For example, the filter characteristic determination unit 1160 may select the second filter characteristic when a ratio, which is obtained by dividing the signal level detected by the signal detection unit 1140 by the noise level detected by the noise detection unit 620, is larger than a predetermined standard, and select the first filter characteristic when the ratio is equal to or less than the standard. Alternatively, the filter characteristic determination unit 1160 may select the second filter characteristic when a difference, which is obtained by subtracting the noise level detected by the noise detection unit 620 from the signal level detected by the signal detection unit 1140, is larger than a predetermined standard, and select the first filter characteristic when the difference is equal to or less than the standard.

In S1340, similarly to S830 in FIG. 8, the filter characteristic determination unit 1160 sets the determined filter characteristic to the decimation filter 200. In S1350, similarly to S840 in FIG. 8, the adaptive filter apparatus 30 down-samples the input signal by the decimation filter 200 to which the filter characteristic is set by the filter characteristic determination unit 1160.

According to the adaptive filter apparatus 30 of the second modification, the filter characteristic of the decimation filter 200 can be adjusted by using the signal level of the signal component to be subjected to the signal processing of the signal processing apparatus 40 (that is, the signal level of the main signal) in addition to the signal level of the inspection target component of the Nyquist frequency or higher (that is, the signal level of the noise). When the main signal is sufficiently large, the adaptive filter apparatus 30 can ensure a sufficient SN ratio in a region lower than the Nyquist frequency by reducing the order of the decimation filter 200 and thus reducing the attenuation amount of the adjustment target component, even if some aliasing noise is generated below the Nyquist frequency. Therefore, according to the adaptive filter apparatus 30 according to the second modification, when the signal component of the main signal is sufficiently large, the attenuation amount of the adjustment target component can be reduced to reduce the delay amount of the decimation filter 200.

Here, from another viewpoint, a noise floor originally lower than the Nyquist frequency is superimposed on the input signal to the adaptive filter apparatus 30. When the signal level output unit 1250 in the signal detection unit 1140 outputs a signal level corresponding to the average value or the average value of the absolute values of the input signals having passed through the LPF 1230, the signal detection unit 1140 outputs a signal level corresponding to the noise floor. Therefore, when the threshold of the allowable amount of the aliasing noise based on the magnitude of the noise floor is used as a standard used for selecting the filter characteristic, and the aliasing noise is sufficiently smaller than the noise floor included in the main signal, the filter characteristic determination unit 1160 can reduce the attenuation amount of the adjustment target component and reduce the delay amount of the decimation filter 200.

Figure 14:
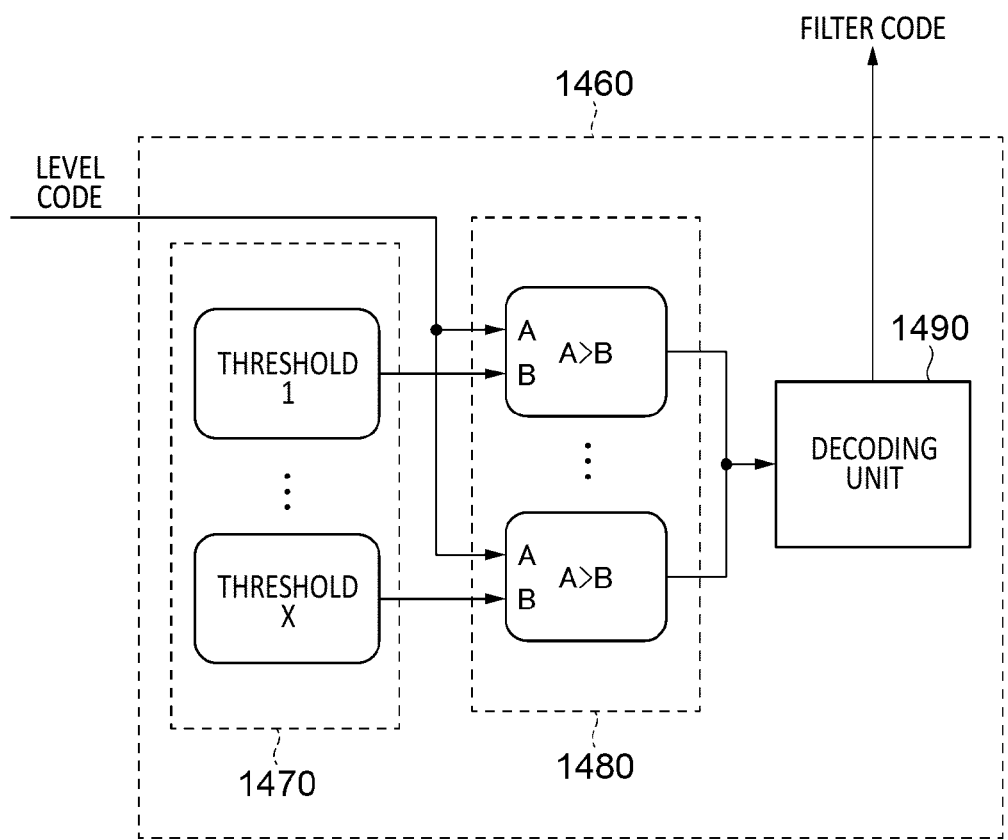
FIG. 14 shows a configuration of a filter characteristic determination unit 1460 according to a third modification of the present embodiment.

FIG. 14 shows a configuration of a filter characteristic determination unit 1460 according to a third modification of the present embodiment. Since the filter characteristic determination unit 1460 is a modification of the filter characteristic determination unit 660 shown in relation to FIGS. 6 and 9, the description thereof will be omitted except for the following differences. The filter characteristic determination unit 1460 determines a filter characteristic to be set to the decimation filter 200 on the basis of the noise level detected by the noise detection unit 620. The filter characteristic determination unit 1460 according to the present modification outputs a filter code as an example of filter identification information for designating a filter characteristic to be set to the decimation filter 200 among two, three, or more filter characteristics on the basis of the noise level detected by the noise detection unit 620.

The filter characteristic determination unit 1460 includes a threshold storage unit 1470, a comparison unit 1480, and a decoding unit 1490. The threshold storage unit 1470 stores a plurality of thresholds 1 to X corresponding to the boundary values for respective filter characteristics in a level code indicating the noise level detected by the noise detection unit 620. Here, X may be a value obtained by subtracting 1 from the number of settable filter characteristics. In the present modification, as an example, threshold 1<threshold 2< . . . <threshold X is satisfied.

The comparison unit 1480 is connected to the threshold storage unit 1470. The comparison unit 1480 has X comparators corresponding to the plurality of thresholds 1 to X, respectively. Each comparator compares the level code with a corresponding threshold. In the present modification, the x-th comparator compares the level code with the x-th threshold x, and outputs a logic H (high) when the level code is larger than the threshold x, and outputs a logic L (low) when the level code is equal to or less than the threshold x.

The decoding unit 1490 is connected to the comparison unit 1480. The decoding unit 1490 determines a value of a filter code for designating a filter characteristic to be set to the decimation filter 200 according to the comparison results output by a plurality of comparators in the comparison unit 1480. For example, when the comparators up to the (x−1)-th comparator of the comparison unit 1480 output the logic H and the x-th and subsequent comparators output the logic L, the decoding unit 1490 outputs a filter code for designating an x-th filter characteristic since the level code exceeds threshold x−1 and is equal to or less than the threshold x. The decoding unit 1490 may be realized by, for example, a priority encoder.

Here, the decoding unit 1490 outputs a filter code for designating a filter characteristic in which the order of the decimation filter 200 and the attenuation amount of the adjustment target component are larger as the level code is larger (that is, the noise level is larger). Accordingly, when the noise level is relatively small, the decoding unit 1490 can set, to the decimation filter 200, a filter characteristic in which the attenuation amount of the adjustment target component is smaller and reduce the order of the decimation filter 200. In addition, when the noise level is relatively large, the decoding unit 1490 can set, to the decimation filter 200, a filter characteristic in which the order of the decimation filter 200 and the attenuation amount of the adjustment target component are relatively large.

Figure 15:
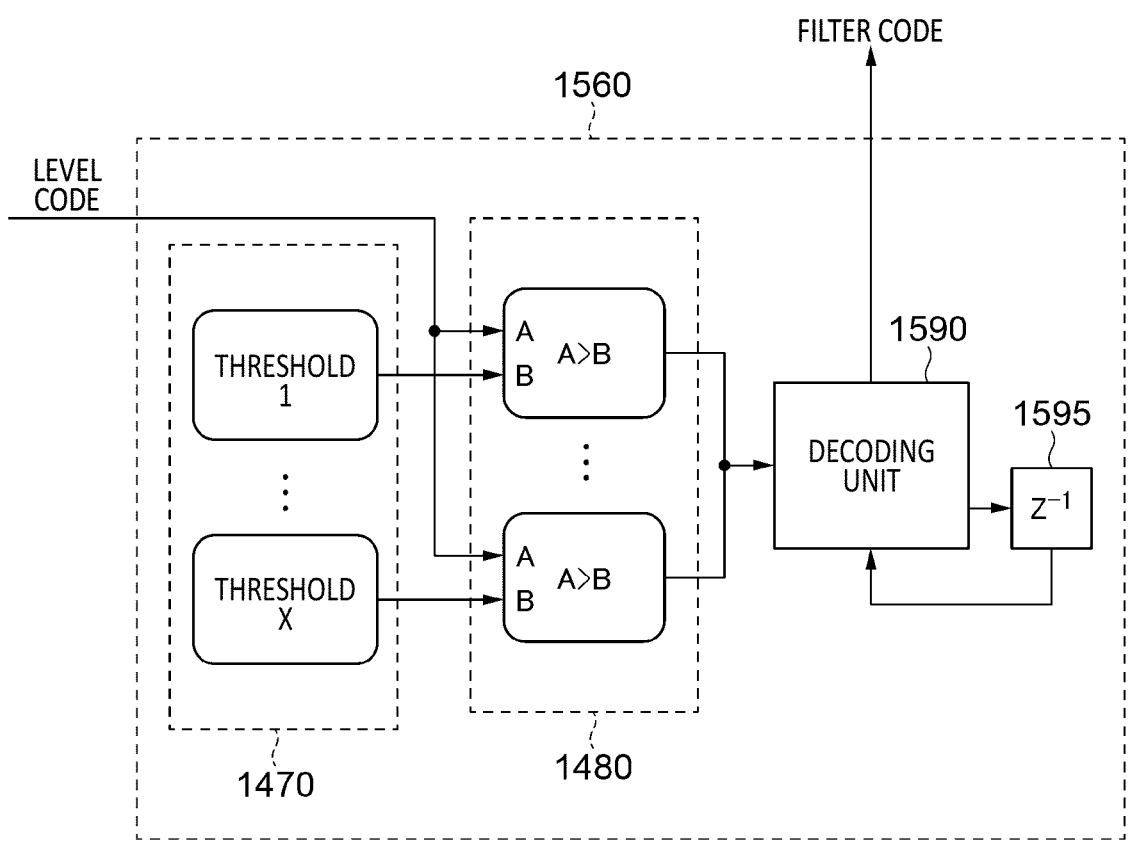
FIG. 15 shows a configuration of a filter characteristic determination unit 1560 according to a fourth modification of the present embodiment.

FIG. 15 shows a configuration of a filter characteristic determination unit 1560 according to a fourth modification of the present embodiment. Since the filter characteristic determination unit 1560 is a modification of the filter characteristic determination unit 1460 shown in relation to FIG. 14, the description thereof will be omitted except for the following differences. The filter characteristic determination unit 1560 determines a filter characteristic to be set to the decimation filter 200 on the basis of the noise level detected by the noise detection unit 620. The filter characteristic determination unit 1560 according to the present modification outputs filter identification information of designating a filter characteristic to be set in the decimation filter 200 among two, three, or more filter characteristics on the basis of the noise level detected by the noise detection unit 620.

The filter characteristic determination unit 1560 according to the present modification has hysteresis in switching of the filter characteristic. The filter characteristic determination unit 1560 includes the threshold storage unit 1470, the comparison unit 1480, a decoding unit 1590, and a delay element 1595. The threshold storage unit 1470 and the comparison unit 1480 have functions and configurations similar to those of the threshold storage unit 1470 and the comparison unit 1480 in FIG. 14.

The decoding unit 1590 is connected to the comparison unit 1480. The decoding unit 1590 determines a value of a filter code for designating a filter characteristic to be set in the decimation filter 200 according to the comparison results output by the plurality of comparators in the comparison unit 1480. The decoding unit 1590 outputs, to the delay element 1595, the internal state of the decoding unit 1590 including the comparison result by the comparison unit 1480, the level code received via the comparison unit 1480, and the like.

The delay element 1595 is connected to the decoding unit 1590. The delay element 1595 delays, by one cycle, the internal state received from the decoding unit 1590 and returns the result to the decoding unit 1590. The decoding unit 1590 can have hysteresis in switching of the filter code by determining the value of the filter code by using the previous state delayed by the delay element 1595. For example, the decoding unit 1590 may update the filter code and update the delay element 1595 according to a comparison result between the level code from the noise detection unit 620 and each of two-stage thresholds having a difference corresponding to a hysteresis width and the value indicating the current filter code held in the delay element 1595 at the timing when the comparison result of the comparison unit 1480 changes.

Figure 16:
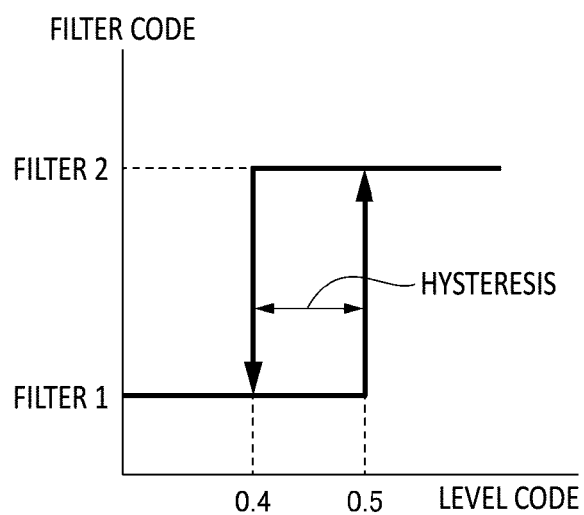
FIG. 16 shows an example of hysteresis provided to a filter code in the fourth modification of the present embodiment.

FIG. 16 shows an example of the hysteresis provided to the filter code in the fourth modification of the present embodiment. In this drawing, a horizontal axis represents the level code, a vertical axis represents the filter code, and the filter code determined by the decoding unit 1590 according to the level code is shown.

In the example of this drawing, the threshold storage unit 1470 stores two values, which has a hysteresis width ("hysteresis" in this drawing) of 0.1, of thresholds of 0.4 and 0.5 with respect to the boundary between the filter codes 1 and 2. The comparison unit 1480 includes two comparators for each boundary of the filter codes, and outputs a 2-bit signal which is a comparison result between the level code and each of the two thresholds. When the value held in the delay element 1595 is a value indicating the filter code 1, the decoding unit 1590 does not increase the filter code even when the level code increases to exceed a threshold of 0.4, and changes the filter code from 1 to 2 in response to the level code further increasing to exceed a threshold of 0.5. Accordingly, the delay element 1595 updates the stored filter code from the value indicating the filter code 1 to the value indicating the filter code 2.

When the value held in the delay element 1595 is a value indicating the filter code 2, the decoding unit 1590 does not reduce the filter code even when the level code decreases to a threshold of 0.5 or less, and changes the filter code from 2 to 1 in response to the level code further decreasing to a threshold of 0.4 or less. Accordingly, the delay element 1595 updates the stored filter code from the value indicating the filter code 2 to the value indicating the filter code 1. When both of a candidate value of a next filter code obtained by comparing the upper threshold for each boundary with the level code and a candidate value of a next filter code obtained by comparing the lower threshold for each boundary with the level code are different from the filter code held in the delay element 1595, the decoding unit 1590 may update the value of the filter code to a candidate value.

According to the filter characteristic determination unit 1560 described above, it is possible to maintain hysteresis in switching of the filter characteristic to be set to the decimation filter 200. Accordingly, when the level code fluctuates at a value close to a boundary of a certain threshold, or the like, the filter characteristic determination unit 1560 can prevent the filter characteristic from being frequently switched, and can stabilize the operation of the adaptive filter apparatus 30.

Figure 17:
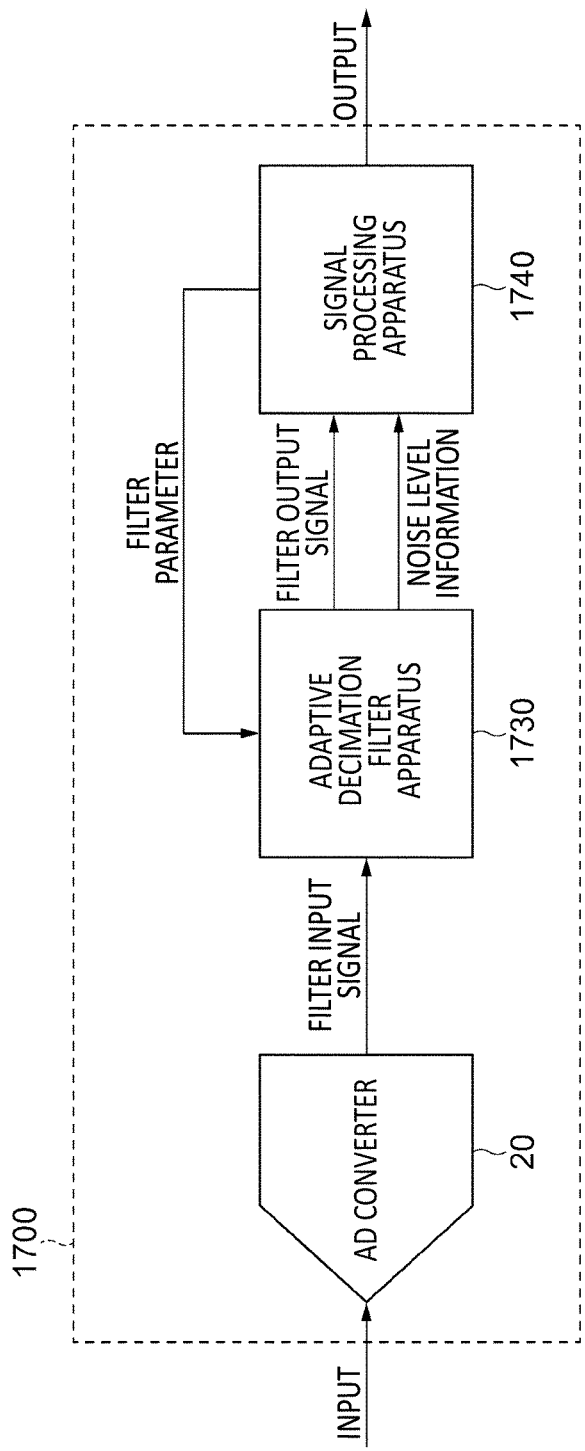
FIG. 17 shows a configuration of a signal processing system 1700 according to a fifth modification of the present embodiment.

FIG. 17 shows a configuration of a signal processing system 1700 according to a fifth modification of the present embodiment. Since the signal processing system 1700 is a modification of the signal processing system 10 shown in relation to FIGS. 1 to 16, the description thereof will be omitted except for the following differences. In the signal processing system 1700, instead of determining the filter characteristic corresponding to the input signal in the adaptive filter apparatus 30, the signal processing apparatus 1740 determines the filter characteristic.

The signal processing system 1700 includes the AD converter 20, an adaptive decimation filter apparatus 1730, and a signal processing apparatus 1740. The AD converter 20 has a function and a configuration similar to those of the AD converter 20 in FIG. 1. The adaptive decimation filter apparatus 1730 includes the decimation filter 200 and the noise detection unit 620 in the filter control unit 210. The decimation filter 200 in the present modification does not have the selector 350 and supplies the filter coefficient included in the filter parameter received from the signal processing apparatus 1740 to each thinning element 310. In the present modification, the noise detection unit 620 in the adaptive decimation filter apparatus 1730 outputs, to the signal processing apparatus 1740, a level code as an example of noise level information indicating the signal level of the inspection target component.

The signal processing apparatus 1740 implements the functions of the filter characteristic determination unit 660 in the filter control unit 210 and the selector 350 in the decimation filter 200 in addition to the signal processing of the signal processing apparatus 40. According to the signal processing system 1700 described above, the signal processing apparatus 1740 performs the processing regarding the determination of the filter characteristic corresponding to the input signal and the setting of the filter characteristic, and thus the configuration of the adaptive decimation filter apparatus 1730 can be simplified. In addition, the signal processing apparatus 1740 can also determine the filter characteristic of the decimation filter 200 by using the result of more advanced analysis processing such as using the DSP or the like, for example, to analyze the input signal or output signal of the adaptive decimation filter apparatus 1730 by discrete Fourier transform (DFT).

Figure 18:
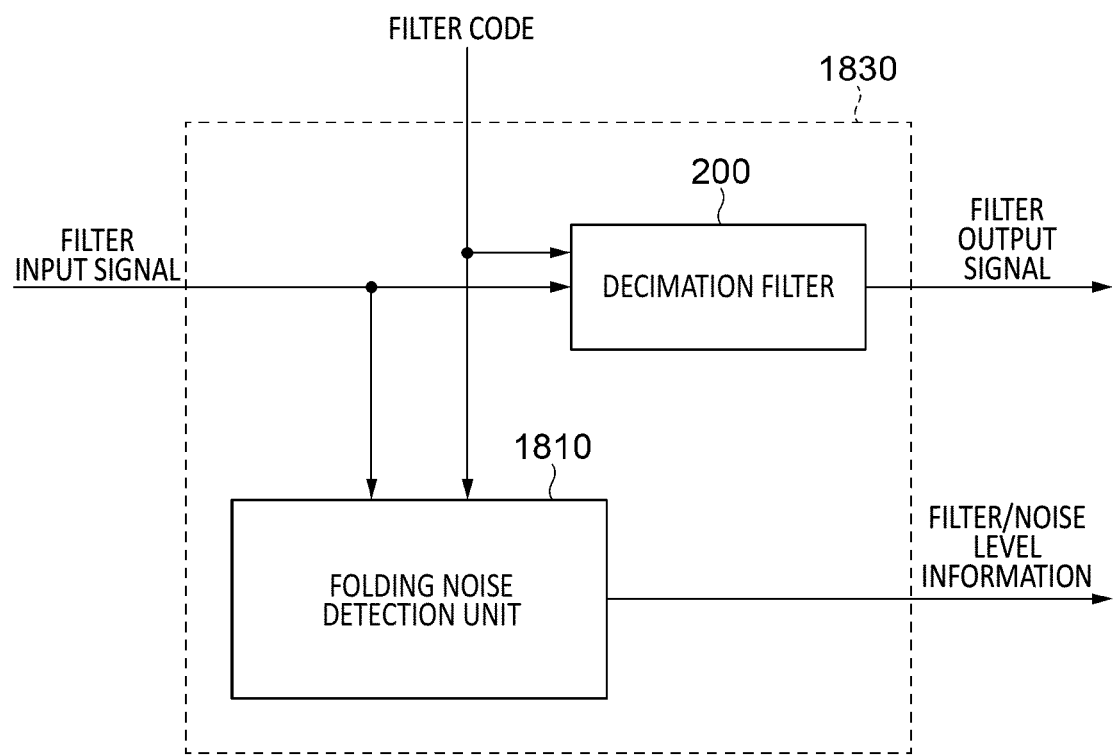
FIG. 18 shows a configuration of an adaptive decimation filter 1830 according to a sixth modification of the present embodiment.

FIG. 18 shows a configuration of an adaptive decimation filter 1830 according to a sixth modification of the present embodiment. Since the adaptive decimation filter 1830 is a modification of the adaptive decimation filter apparatus 1730 in the signal processing system 1700 shown in FIG. 17, the description thereof will be omitted except for the following differences. The adaptive decimation filter apparatus 1830 includes the decimation filter 200 and an aliasing noise detection unit 1810.

The decimation filter 200 may have a function and a configuration similar to those of the decimation filter 200 shown in FIG. 3. In the present modification, the decimation filter 200 receives a filter code as an example of the filter parameter and is set to the filter characteristic corresponding to the filter code.

The aliasing noise detection unit 1810 receives the input signal and the filter code. The aliasing noise detection unit 1810 calculates the level of aliasing noise generated when the inspection target component in the input signal is sent back below the Nyquist frequency after the decimation by the decimation filter 200. In the present modification, the aliasing noise detection unit 1810 calculates the level of aliasing noise remaining in the output signal when the decimation filter 200 is set to the filter characteristic corresponding to the filter code received from the signal processing apparatus 1740. The aliasing noise detection unit 1810 outputs, to the signal processing apparatus 1740, filter/noise level information including filter identification information such as a filter code for identifying the filter set in the decimation filter 200 and noise level information indicating the level of aliasing noise.

Figure 19:
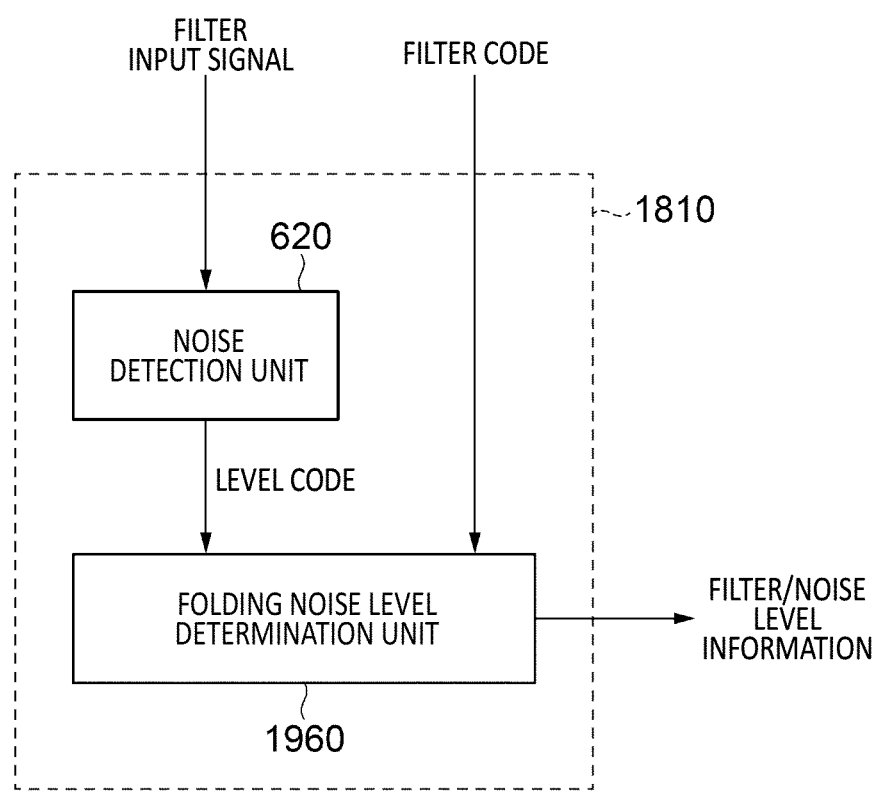
FIG. 19 shows a configuration of an aliasing noise detection unit 1810 according to the sixth modification of the present embodiment.

FIG. 19 shows a configuration of the aliasing noise detection unit 1810 according to the sixth modification of the present embodiment. The aliasing noise detection unit 1810 includes the noise detection unit 620 and an aliasing noise level determination unit 1960. The noise detection unit 620 may have a function and a configuration similar to those of the noise detection unit 620 shown in FIG. 7.

The aliasing noise level determination unit 1960 is connected to the noise detection unit 620. The aliasing noise level determination unit 1960 receives the level code indicating the noise level detected by the noise detection unit 620 and the filter code received from the signal processing apparatus 1740. The aliasing noise level determination unit 1960 calculates the level of aliasing noise remaining in the output signal when the signal level of the inspection target component indicated by the level code is attenuated by the decimation filter 200 having the filter characteristic corresponding to the filter code. The aliasing noise level determination unit 1960 outputs, to the signal processing apparatus 1740, the noise level information indicating the calculated level of aliasing noise together with the filter identification information such as the filter code.

Figure 20:
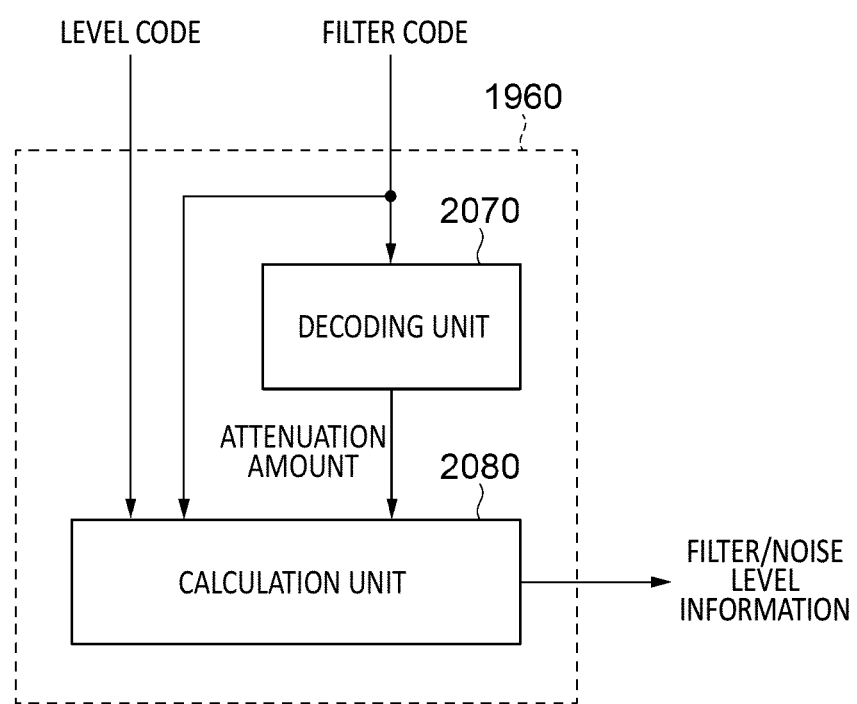
FIG. 20 shows a configuration of an aliasing noise level determination unit 1960 according to the sixth modification of the present embodiment.

FIG. 20 shows a configuration of the aliasing noise level determination unit 1960 according to the sixth modification of the present embodiment. The aliasing noise level determination unit 1960 includes a decoding unit 2070 and a calculation unit 2080.

The decoding unit 2070 decodes the filter code and outputs the aliasing noise attenuation amount of the decimation filter 200 in the filter characteristic corresponding to the filter code. For example, for each possible value of the filter code, the decoding unit 2070 may hold a table storing the aliasing noise attenuation amount of the decimation filter 200 when the filter characteristic corresponding to the value of the filter code is set to the decimation filter 200, and output the aliasing noise attenuation amount corresponding to the input filter code. Alternatively, when receiving a filter parameter or the like including a filter coefficient, the decoding unit 2070 may calculate the aliasing noise attenuation amount of the decimation filter 200 by using the filter coefficient.

The calculation unit 2080 is connected to the decoding unit 2070. The calculation unit 2080 calculates the level of aliasing noise remaining in the output signal when the aliasing noise having the magnitude indicated by the level code is attenuated by the aliasing noise attenuation amount received from the decoding unit 2070.

For example, when the level code is 0.5 and the aliasing noise attenuation amount is $1/10$, the calculation unit 2080 calculates that the level of aliasing noise remaining in the output signal is 0.05 (0.5×$1/10$). In this manner, the calculation unit 2080 may calculate the level of aliasing noise remaining in the output signal by multiplying the signal level of the inspection target component indicated by the level code by the aliasing noise attenuation amount. In addition, when the unit of the level code and the aliasing noise attenuation amount is dB, the calculation unit 2080 may calculate the level of aliasing noise remaining in the output signal by subtracting the dB value of the aliasing noise attenuation amount from the dB value of the level code.

The calculation unit 2080 outputs, to the signal processing apparatus 1740, the noise level information indicating the calculated level of aliasing noise together with the filter identification information such as the filter code. Here, instead of directly outputting the level of aliasing noise as the noise level information, the calculation unit 2080 may output noise level information indicating a result of comparing the level of aliasing noise with a threshold (for example, whether the level is larger than the threshold), noise level information obtained by quantizing the aliasing noise level, or the like.

FIG. 21 shows an example of filter/noise level information according to the sixth modification of the present embodiment. In the present modification, the filter/noise level information is represented by two bits, FN1 and FN0. FN1 indicates noise level information. The calculation unit 2080 sets FN1 to 0 when the level of aliasing noise exceeds −100 dBFS, and sets FN1 to 1 when the level of aliasing noise is −100 dBFS or less.

FN0 indicates the filter identification information. For example, the calculation unit 2080 sets FN0 to 0 in a filter mode 1 for designating the filter 1, and sets FN0 to 1 in a filter mode 2 for designating the filter 2. The delay amount (delay time) of the decimation filter 200 varies depending on the filter mode, and is equivalent to four cycles of the sampling cycle (1/fs) of the output signal in the case of the filter mode 1, and is equivalent to six cycles of the sampling cycle of the output signal in the case of the filter mode 2.

According to the adaptive decimation filter 1830 according to the present modification, the filter characteristic corresponding to the input signal can determined in the signal processing apparatus 1740, and the filter characteristic of the decimation filter 200 can be flexibly changed according to the application of the signal processing system 1700. In addition, since the adaptive decimation filter apparatus 1830 provides the signal processing apparatus 1740 with the filter/noise level information including the noise level information indicating the level of the aliasing noise remaining in the output signal, the signal processing apparatus 1740 can appropriately determine the filter characteristic of the decimation filter 200 by using the filter/noise level information without knowing the specific values of the noise attenuation amount and the delay amount for each filter characteristic that can be set to the decimation filter 200.

Figure 22:
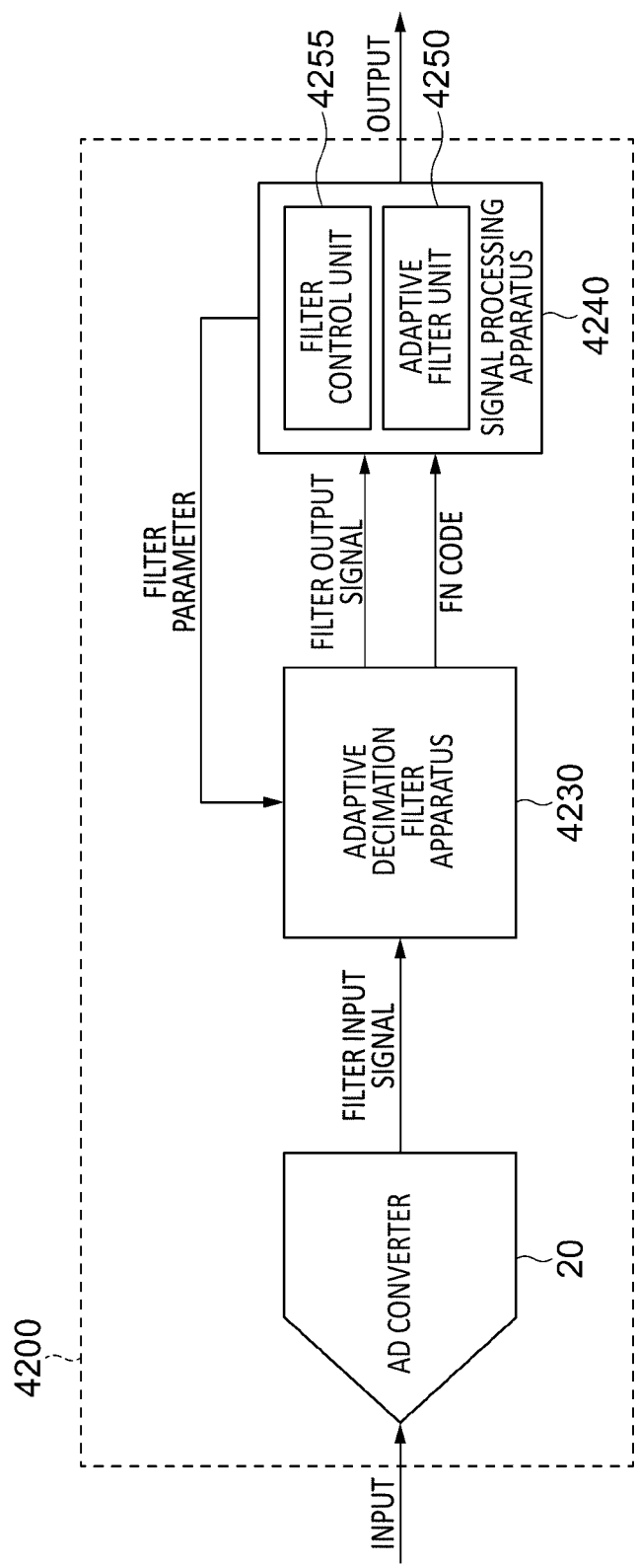
FIG. 22 shows a configuration of a signal processing system 4200 according to a seventh modification of the present embodiment.

FIG. 22 shows a configuration of a signal processing system 4200 according to a seventh modification of the present embodiment. For example, in a real-time signal processing application such as active noise control (ANC) or motional feedback (MFB), a signal processing system needs to suppress a delay time from receiving an input signal to outputting a signal-processed output signal within an allowable range. The active noise canceller described in Patent Document 2 operates at a considerably high oversampling data rate of 384 KHz while a noise canceling target frequency is 1 KHz or less, thereby reducing the delay time by not using a decimation filter.

However, in the active noise canceller described in Patent Document 2, since signal processing is performed at a considerably high rate with respect to a signal processing target frequency, power consumption increases, and a signal processing circuit capable of performing high-speed signal processing is required. In addition, when the operation frequency of the signal processing circuit is high, there is a possibility that large switching noise occurs, and the noise canceling performance is deteriorated due to interference with a feedback path and a feedforward path for performing noise canceling.

The signal processing system 4200 according to the present modification can perform signal processing at a relatively low data rate by using an adaptive decimation filter apparatus 4230 capable of adjusting the filter characteristic and the delay time according to the characteristic of the input signal. Then, the signal processing system 4200 performs signal processing adapted to the filter characteristic of the adaptive decimation filter apparatus 4230 in a signal processing apparatus 4240, thereby adjusting a balance between the decimation processing and the signal processing and generating a more suitable signal processing output within the given delay time limit.

Since the signal processing system 4200 according to the present modification is a modification of the signal processing system 1700 shown in FIGS. 17 to 21, the description thereof will be omitted except for the following differences. In the signal processing system 4200, instead of determining the filter characteristic corresponding to the input signal in the adaptive decimation filter apparatus 4230 corresponding to the adaptive filter apparatus 30 of the signal processing system 10, the signal processing apparatus 4240 determines the filter characteristic.

The signal processing system 4200 includes the AD converter 20, the adaptive decimation filter apparatus 4230, and the signal processing apparatus 4240. The AD converter 20 is similar to the AD converter 20 shown in FIG. 1, and converts an analog input signal into a digital input signal and supplies the result to the adaptive decimation filter apparatus 4230.

Since the adaptive decimation filter apparatus 4230 has a function and a configuration similar to those of the adaptive decimation filter apparatus 1730 shown in relation to FIGS. 17 to 21, the description thereof will be omitted except for the following differences. The adaptive decimation filter apparatus 4230 outputs a filter output signal (output signal) obtained by down-sampling the filter input signal (input signal).

As shown in FIG. 18, the adaptive decimation filter apparatus 4230 may include the decimation filter 200 and the aliasing noise detection unit 1810. The decimation filter 200 outputs an output signal obtained by down-sampling the input signal. The decimation filter 200 receives a filter code as an example of the filter parameter and is set to the filter characteristic corresponding to the filter code.

The aliasing noise detection unit 1810 detects the magnitude of aliasing noise which is folded back to a frequency lower than the Nyquist frequency in the output signal of the decimation filter 200 by down-sampling. The aliasing noise detection unit 1810 outputs, to the signal processing apparatus 4240, noise level information indicating the level of aliasing noise. In addition, the aliasing noise detection unit 1810 may output, to the signal processing apparatus 4240, filter identification information for identifying the filter characteristic set to the decimation filter 200. Here, the filter characteristic includes the order of the decimation filter 200. As shown in FIG. 18, the aliasing noise detection unit 1810 may output, to the signal processing apparatus 4240, filter/noise level information including the noise level information and the filter identification information. In FIG. 22, data as an example of the filter/noise level information is indicated as an FN code (filter/noise code).

As shown in FIG. 19, the aliasing noise detection unit 1810 may include the noise detection unit 620 and the aliasing noise level determination unit 1960. The noise detection unit 620 detects a signal level of at least a part of frequencies, which are equal to or higher than the Nyquist frequency, in the input signal, that is, a signal level of the detection target component. The aliasing noise level determination unit 1960 calculates the magnitude of aliasing noise remaining in the output signal of the decimation filter 200 when the noise of the signal level of the detection target component detected by the noise detection unit 620 is attenuated by the decimation filter 200 of which the filter characteristic has been adjusted. The aliasing noise level determination unit 1960 may have the configuration shown in FIG. 20.

The signal processing apparatus 4240 is a modification of the signal processing apparatus 1740 shown in FIG. 17. The signal processing apparatus 4240 receives the output signal of the adaptive decimation filter apparatus 4230 and the filter identification information from the adaptive decimation filter apparatus 4230. The signal processing apparatus 4240 performs, on the output signal of the adaptive decimation filter apparatus 4230, signal processing corresponding to the filter identification information for identifying the filter characteristic including the order of the decimation filter 200, and outputs the result of the signal processing.

The signal processing apparatus 4240 includes an adaptive filter unit 4250 and a filter control unit 4255. The adaptive filter unit 4250 performs filter processing on the output signal of the adaptive decimation filter apparatus

4230. The adaptive filter unit 4250 may perform the filter processing corresponding to the filter identification information on the output signal of the adaptive decimation filter apparatus 4230.

The filter control unit 4255 adjusts the filter characteristic of the decimation filter 200 in the adaptive decimation filter apparatus 4230 on the basis of the magnitude (noise level information) of the aliasing noise received from the adaptive decimation filter apparatus 4230. Accordingly, the filter control unit 4255 may adjust the order of the decimation filter 200 on the basis of the magnitude of the aliasing noise. The filter control unit 4255 sets the filter characteristic of the decimation filter 200 by supplying, to the adaptive decimation filter apparatus 4230, a filter parameter corresponding to a filter characteristic to be set to the decimation filter 200. Here, the filter parameter may include each filter order/coefficient to be set to the decimation filter 200.

Figure 23:
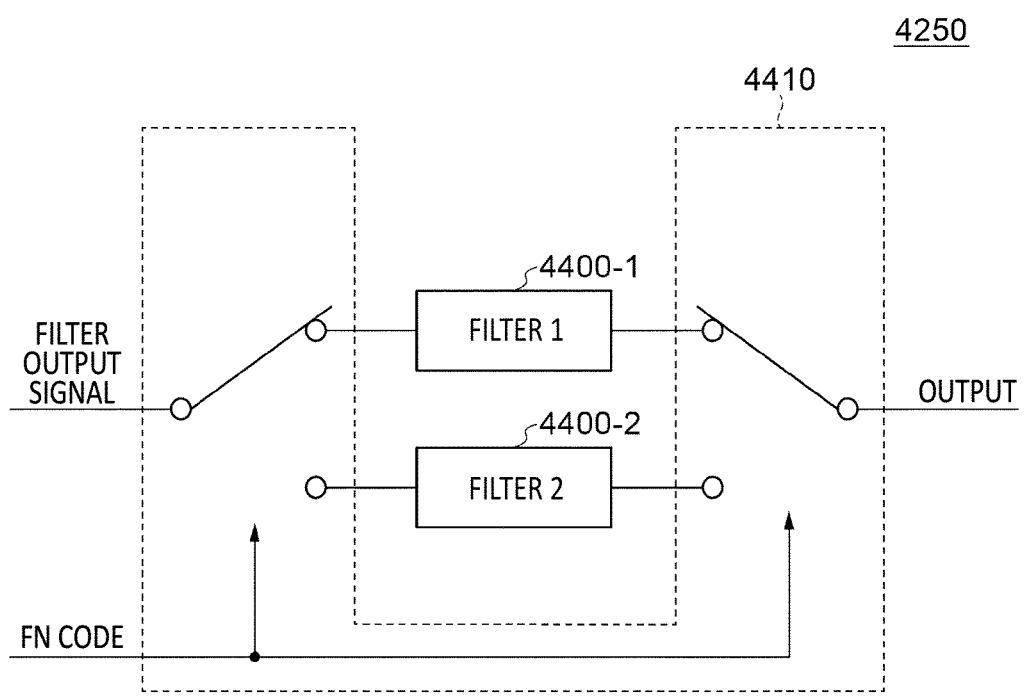
FIG. 23 shows a configuration of an adaptive filter unit 4250 according to the seventh modification of the present embodiment.

FIG. 23 shows a configuration of the adaptive filter unit 4250 according to the seventh modification of the present embodiment. The adaptive filter unit 4250 includes a plurality of filters 4400-1 to 2 (also referred to as a "filter 4400") and a selection unit 4410.

Each of the plurality of filters 4400 performs, on the output signal from the adaptive decimation filter apparatus 4230, the filter processing corresponding to the purpose of use of the signal processing system 4200. For example, when the signal processing system 4200 is used for ANC, each filter 4400 receives the output signal obtained by down-sampling the input signal, and performs filter processing of generating a noise canceling signal for removing the noise included in the output signal. The plurality of filters 4400 may have filter characteristics different from each other.

On the basis of the filter identification information from the adaptive decimation filter apparatus 4230, the selection unit 4410 selects the filter 4400 to perform the filter processing from among the plurality of filters 4400. In the example of this drawing, the selection unit 4410 switches the filter, which is to be supplied with the output signal from the adaptive decimation filter apparatus 4230, among the plurality of filters 4400 according to FN0 of the FN codes from the adaptive decimation filter apparatus 4230. In addition, the selection unit 4410 selects, as the output of the selection unit 4410, the output of the filter 4400, which has performed the signal processing on the output signal from the adaptive decimation filter apparatus 4230, among the plurality of filters 4400.

Here, the adaptive filter unit 4250 may include one filter 4400 for each type of filter identification information. In this case, the selection unit 4410 can select one filter 4400 associated with the filter identification information from the adaptive decimation filter apparatus 4230. Alternatively, the adaptive filter unit 4250 may include two or more filters 4400 for each type of filter identification information. In this case, from among the two or more filters 4400 associated with the filter identification information from the adaptive decimation filter apparatus 4230, the selection unit 4410 may select the filter 4400 to be used according to the operation mode set in the signal processing system 4200, the characteristic of the input signal, and other conditions.

Instead of the configuration described above, the adaptive filter unit 4250 may include a filter processing apparatus capable of changing a set of filter parameters such as a filter coefficient. In this case, the selection unit 4410 may operate the filter processing apparatus as the filter 4400 corresponding to the filter identification information by switching the set of filter parameters to be set in the filter processing apparatus according to the filter identification information.

Figure 24:
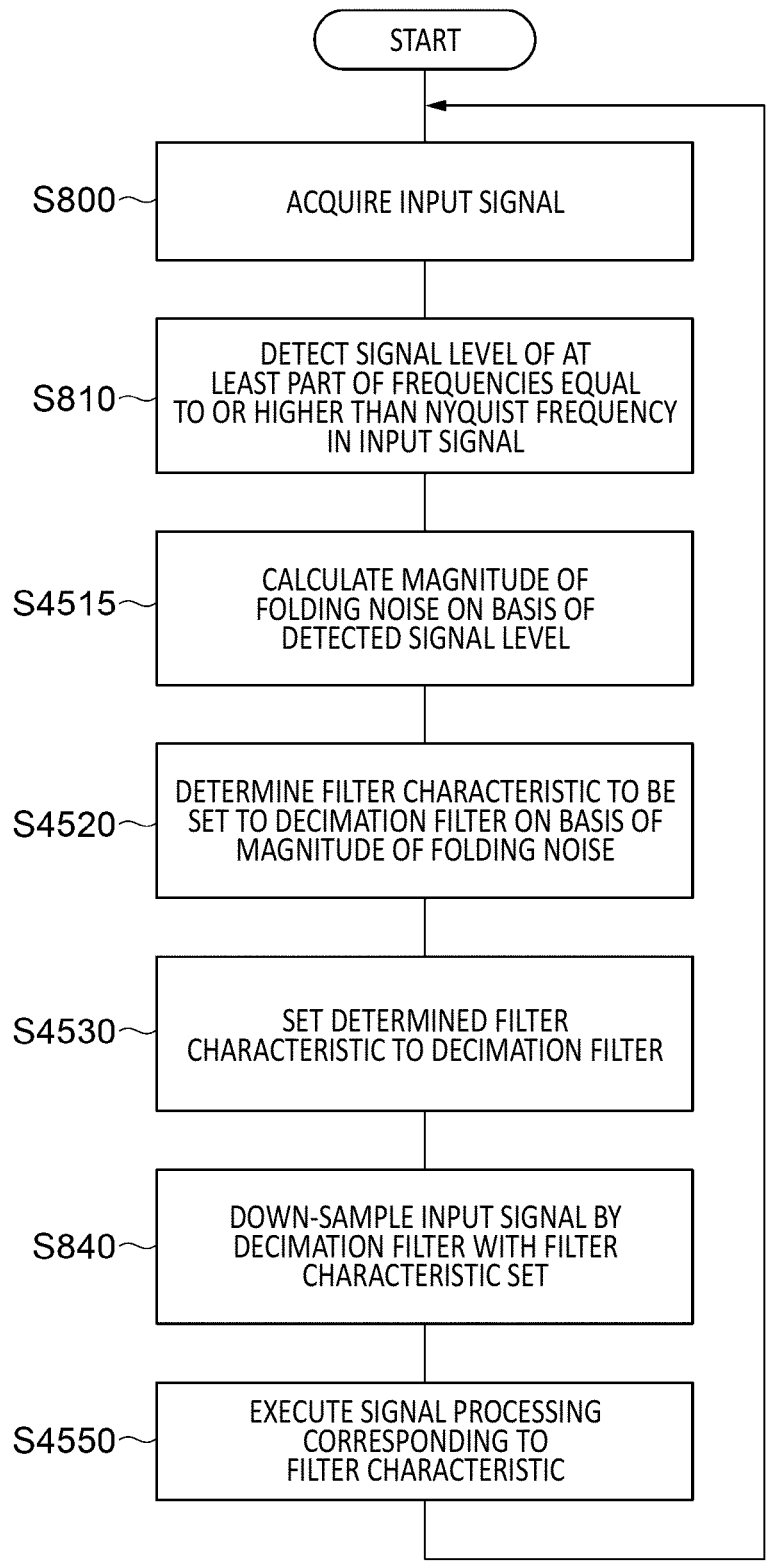
FIG. 24 shows an operation flow of the signal processing system 4200 according to the seventh modification of the present embodiment.

FIG. 24 shows an operation flow of the signal processing system 4200 according to the seventh modification of the present embodiment. Since the operation flow of this drawing is a modification of the operation flow shown in FIG. 8, the description thereof will be omitted except for the following differences.

In step S800, the AD converter 20 converts an analog input signal into a digital input signal by sampling the analog input signal. In S810, the noise detection unit 620 in the adaptive decimation filter apparatus 4230 detects the signal level of at least a part of frequencies, which are equal to or higher than the Nyquist frequency, in the input signal in a similar manner to S810 in FIG. 8.

In S4515, the aliasing noise level determination unit 1960 in the adaptive decimation filter apparatus 4230 calculates the magnitude of aliasing noise remaining in the output signal of the decimation filter 200 on the basis of the signal level detected by the noise detection unit 620. The aliasing noise level determination unit 1960 outputs, to the signal processing apparatus 4240, filter/noise level information including the noise level information indicating the magnitude of aliasing noise and the filter identification information. The filter/noise level information is, for example, the FN code shown in FIG. 21.

Step S4520 is a modification of step S820 in FIG. 8. In S4520, the filter control unit 4255 in the signal processing apparatus 4240 determines a filter characteristic to be set to the decimation filter 200 on the basis of the noise level information and the filter identification information. In the present modification, the filter control unit 4255 determines the filter characteristic of the decimation filter 200 on the basis of the noise level information and the filter identification information from the adaptive decimation filter apparatus 4230. Alternatively, the filter control unit 4255 may hold the filter identification information set to the decimation filter 200 by the filter control unit 4255 itself, and determine the filter characteristic by using the relevant filter identification information.

When the aliasing noise is relatively large, the filter control unit 4255 may determine a filter characteristic with a longer delay time instead of a larger attenuation amount of the adjustment target component. When the aliasing noise is relatively small, the filter control unit 4255 may determine a filter characteristic with a smaller attenuation amount of the adjustment target component but a shorter delay time. In the present modification, the filter control unit 4255 determines the filter characteristic including the order of the decimation filter 200 on the basis of the magnitude of the aliasing noise. The filter control unit 4255 may determine to set a certain first filter characteristic to the decimation filter 200 when the magnitude of the aliasing noise is larger than a predetermined standard, and may determine to set a second filter characteristic, which has an order smaller than that of the first filter characteristic, to the decimation filter 200 when the magnitude of the aliasing noise is equal to or smaller than the standard.

Here, the magnitude of the aliasing noise is based on the decimation filter 200 of which the filter characteristic have been set. Therefore, when the magnitude of the aliasing noise is larger than a predetermined upper limit value, the filter control unit 4255 may determine to set, to the decimation filter 200, the filter characteristic in which the attenuation amount of the adjustment target component is larger than the current filter characteristic. In addition, when the magnitude of the aliasing noise is smaller than a predetermined lower limit value, the filter control unit 4255 may determine to set, to the decimation filter 200, the filter characteristic in which the attenuation amount of the adjustment target component is smaller than the current filter characteristic. Accordingly, the filter control unit 4255 can determine the filter characteristic of the decimation filter 200 so as to keep the magnitude of the aliasing noise between the lower limit value and the upper limit value, and can keep the delay amount of the decimation filter 200 small while sufficiently suppressing the magnitude of the aliasing noise.

The filter control unit 4255 may determine to set, to the decimation filter 200, the filter characteristic of the order, in which the magnitude of the aliasing noise is equal to or less than the predetermined standard and the delay time of the decimation filter 200 is minimized, among the plurality of filter characteristic. For example, it is assumed that a first filter characteristic in which the attenuation amount of the adjustment target component is −20 dB, a second filter characteristic in which the attenuation amount is −40 dB, and a third filter characteristic in which the attenuation amount is −60 dB are selectable, and the upper limit value of the magnitude of the aliasing noise is −60 dBFS. Here, assuming that the third filter characteristic is currently selected and the magnitude of the aliasing noise is −80 dBFS to −100 dBFS, the magnitude of the aliasing noise is smaller than the upper limit by 20 dBFS, and thus the filter control unit 4255 can select the second filter characteristic in which the magnitude of the aliasing noise increases by 20 dBFS.

In addition, the filter control unit 4255 may adjust the phase of the output signal output by the decimation filter 200 according to the adjustment of the order of the decimation filter 200 or another filter characteristic. The filter control unit 4255 may adjust the phase of the output signal output by the decimation filter 200 according to the filter identification information. For example, the filter control unit 4255 may determine the order of the decimation filter 200 or the delay amount from the filter identification information from the adaptive decimation filter apparatus 4230, determine a filter characteristic for increasing or reducing the relevant order or delay amount, and set the filter characteristic to the decimation filter 200. Accordingly, as described later with respect to S4550, the signal processing apparatus 4240 can adjust the phase of the output of the signal processing apparatus 4240 while keeping the filter characteristic of the adaptive filter unit 4250 fixed, so that the phase matches a target phase.

Step S4530 is a modification of step S830 in FIG. 8. In S4530, the filter control unit 4255 in the signal processing apparatus 4240 sets the determined filter characteristic to the decimation filter 200. Accordingly, the filter control unit 4255 can adjust the order of the decimation filter 200 and the attenuation amount of the adjustment target component according to the magnitude of the aliasing noise detected by the aliasing noise detection unit 1810.

Similarly to S830 in FIG. 8, the filter control unit 4255 may detect a zero-cross timing at which the positive and negative of the output signal from the adaptive decimation filter apparatus 4230 are switched, and change the filter characteristic according to the zero-cross timing. Alternatively, the adaptive decimation filter apparatus 4230 having received the setting of the filter characteristic from the filter control unit 4255 may detect the zero-cross timing at which the positive and negative of the filter input signal are switched, and change the filter characteristic according to the zero-cross timing.

In addition, the filter control unit 4255 or the adaptive decimation filter apparatus 4230 may change the filter characteristic of the decimation filter 200 stepwise from the current filter characteristic to a target filter characteristic. Accordingly, the filter control unit 4255 or the adaptive decimation filter apparatus 4230 can suppress the uncomfortable feeling generated in an audio signal such as the noise canceling signal generated according to the signal processing result of the output signal.

S840 is similar to S840 in FIG. 8. In S840, the adaptive decimation filter apparatus 4230 down-samples the input signal by using the decimation filter 200 to which the filter characteristic determined on the basis of the characteristic of the input signal is set. The adaptive decimation filter apparatus 4230 outputs, to the signal processing apparatus 4240, the output signal of the decimation filter 200, the noise level information, and the filter identification information for identifying the filter characteristic of the decimation filter 200.

In S4550, the signal processing apparatus 4240 performs signal processing, which corresponds to the filter identification information, on the output signal of the adaptive decimation filter apparatus 4230, and outputs the result of the signal processing. The adaptive decimation filter apparatus 4230 performs decimation processing suitable for the characteristic of the input signal, and the delay time from when the adaptive decimation filter apparatus 4230 receives the input signal to when the adaptive decimation filter apparatus outputs the output signal varies depending on the type of decimation processing. In the real-time signal processing, since there is an upper limit to the delay time of the signal processing of the entire signal processing system 4200, and it is required to output the signal processing result of a predetermined phase with respect to the input, the signal processing apparatus 4240 changes the type of the signal processing according to the type of the decimation processing in the adaptive decimation filter apparatus 4230.

When the filter control unit 4255 adjusts the order of the decimation filter 200 on the basis of the characteristic of the input signal, the adaptive filter unit 4250 adjusts the phase with respect to the output signal of the decimation filter 200 according to the filter identification signal, and performs target signal processing. For this purpose, the adaptive filter unit 4250 may select the filter 4400, which performs filter processing of offsetting a change in the delay time of the decimation filter 200 due to the adjustment of the order, according to the filter identification information. Accordingly, when the delay time of the decimation filter 200 is relatively long, the adaptive filter unit 4250 can select the filter 4400, which has a shorter signal processing time, to suppress the delay time of the entire signal processing system 4200 to an upper limit value or less. In addition, when the delay time of the decimation filter 200 is relatively short, the adaptive filter unit 4250 can select the filter 4400, which has a longer signal processing time but higher accuracy, to output a signal processing result with higher accuracy while suppressing the delay time of the entire signal processing system 4200 to the upper limit value or less.

In addition, the adaptive filter unit 4250 may select the filter 4400 having a relatively short delay time even when the delay time of the decimation filter 200 is relatively short. In this case, when the delay time of the decimation filter 200 is short, the signal processing system 4200 can shorten the signal processing time of the entire signal processing system 4200 and generate an output to respond to the input to the signal processing system 4200 at a higher speed.

Figure 35:
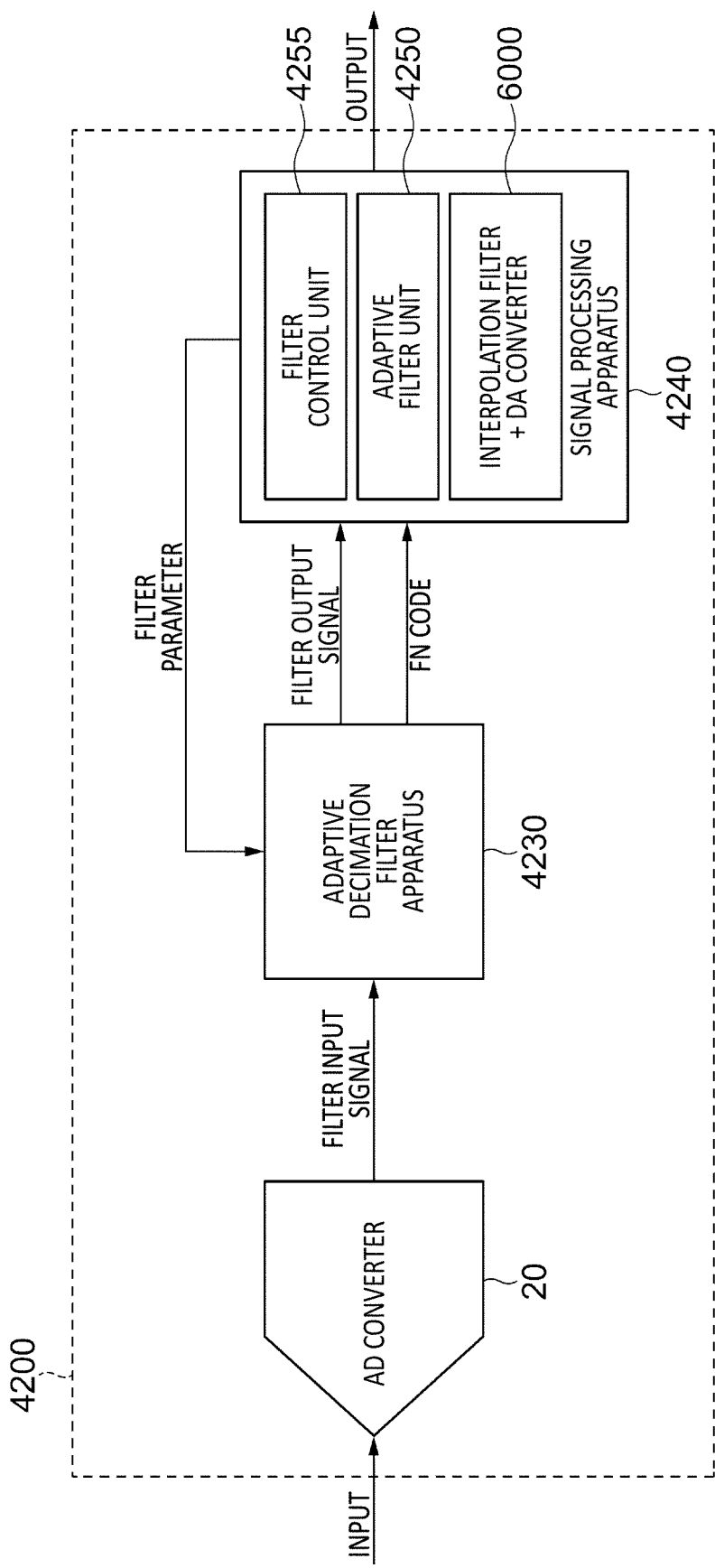
FIG. 35 shows a modification of the signal processing system 4200 according to the seventh modification of the present embodiment.

In addition, as shown in FIG. 35, the signal processing apparatus 4240 may be equipped with an interpolation filter/DA converter 6000. As described in relation to FIG. 22, since the target frequency of noise canceling of the active noise canceller is, for example, 1 kHz or less, it is usually preferable that the signal processing apparatus 4240 perform signal processing at a relatively low data rate such as 2 kHz. On the other hand, since the DA converter is required to operate at a relatively high data rate, for example, about 19 times (384 KHz) or more an audible frequency band in order to improve the sound quality, a deviation occurs between the data rate of the signal processing circuit and the data rate of the DA converter. Therefore, when the signal processing circuit such as the adaptive filter unit 4250 is operated at a relatively low data rate, the signal processing circuit 4240 needs to perform up-sampling in order to convert the data rate of the signal processing circuit to a relatively high data rate. An interpolation filter is introduced so as not to generate an image component due to up-sampling at time of up-sampling, but the delay time of the interpolation filter also depends on the setting of the interpolation filter. Therefore, the signal processing apparatus 4240 according to the modification of the signal processing system 4200 shown in FIG. 35 sets the filter characteristic of the interpolation filter in the interpolation filter/DA converter 6000 by using the filter parameter output by the filter control unit 4255. Accordingly, when the filter control unit 4255 sets the delay time of the adaptive decimation filter apparatus 4230 to be short, the signal processing apparatus 4240 can also set the delay time of the interpolation filter to be short in conjunction with this, and can generate an output to respond to the input to the signal processing system 4200 at an even higher speed.

In addition, the adaptive filter unit 4250 may control the filter characteristic of the filter processing regardless of the delay time of the decimation filter 200 without using the filter identification signal output from the adaptive decimation filter apparatus 4230. The filter control unit 4255 controls the delay time of the decimation filter 200 to be adjusted according to the phase to be included in the output of the signal processing apparatus 4240, so that the filter processing can be performed without the adaptive filter unit 4250 offsetting the change in the delay time of the decimation filter 200. In this way, the filter control unit 4255 can adjust the delay time from the AD converter 20 to the output of a signal processing apparatus 4240 as much as the adjustment of the delay time of the decimation filter 200.

In addition, the signal processing apparatus 4240 can arbitrarily control the delay time from the AD converter 20 to the output of the signal processing apparatus 4240 by controlling the adaptive decimation filter apparatus 4230. For example, the signal processing apparatus 4240 can adjust the phase such that the output of the signal processing apparatus 4240 is closest to a target signal by adjusting the delay time of the decimation filter 200 while keeping the filter characteristic of the adaptive filter unit 4250 fixed. After adjusting the phase of the output of the signal processing apparatus 4240, the signal processing apparatus 4240 may further adjust the filter characteristic of the adaptive filter unit 4250 to optimize the output of the signal processing apparatus 4240 so as to further approach the target signal. In this manner, in a system, such as an ANC system, in which output phase adjustment is required, the signal processing system 4200 can improve the accuracy of the output phase adjustment and can improve the performance of noise canceling.

According to the signal processing system 4200 described above, the signal processing apparatus 4240 can change the filter characteristic of the decimation filter 200 in adapting to the characteristic of the input signal, and perform signal processing corresponding to the filter characteristic set to the decimation filter 200. Accordingly, the signal processing system 4200 can also optimize both the decimation processing and the signal processing so as to bring the output signal close to a target value.

In addition, similarly to the signal processing system 1700 of FIG. 17, in the signal processing system 4200, the signal processing apparatus 4240 performs the processing regarding the determination of the filter characteristic corresponding to the input signal and setting of the filter characteristic, and thus the configuration of the adaptive decimation filter apparatus 4230 can be simplified. In addition, the signal processing apparatus 4240 can also determine the filter characteristic of the decimation filter 200 by using the result of more advanced analysis processing such as using the DSP or the like, for example, to analyze the input signal or output signal of the adaptive decimation filter apparatus 4230 by discrete Fourier transform (DFT).

Figure 25:
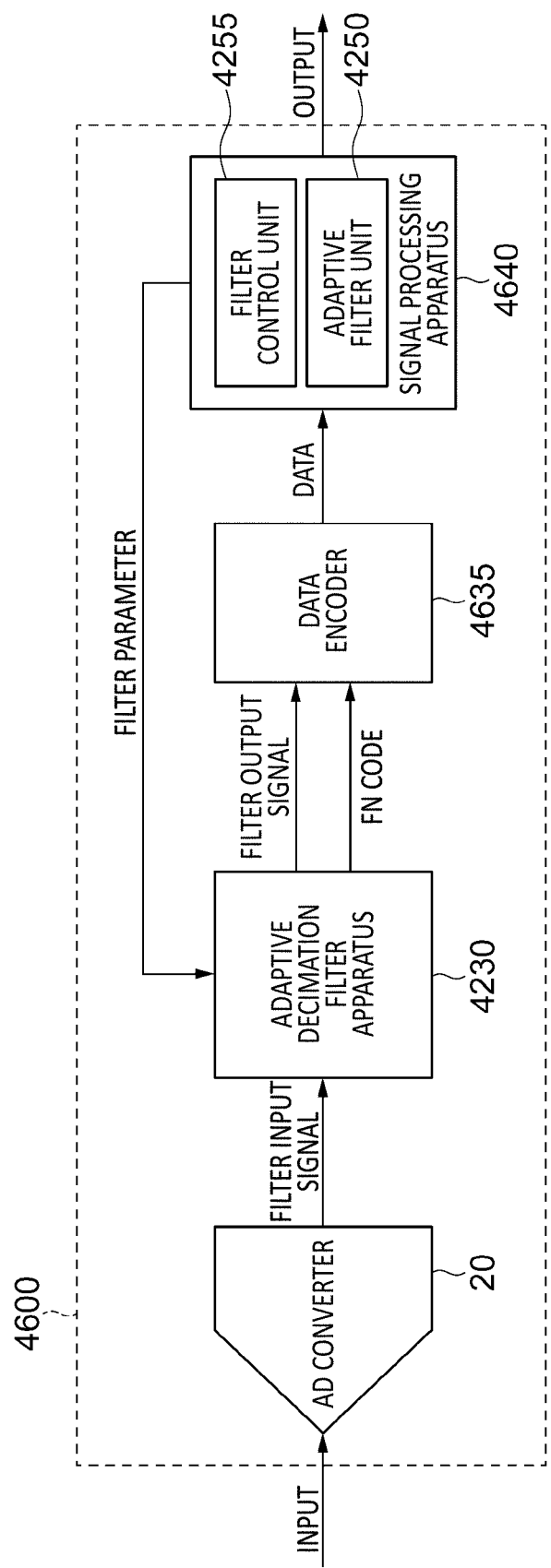
FIG. 25 shows a configuration of a signal processing system 4600 according to an eighth modification of the present embodiment.

FIG. 25 shows a configuration of a signal processing system 4600 according to an eighth modification of the present embodiment. Since the signal processing system 4600 is a modification of the signal processing system 1700 shown in FIGS. 17 to 21 and the signal processing system 4200 shown in FIG. 22, the description thereof will be omitted except for the following differences. The signal processing system 4600 includes the AD converter 20, the adaptive decimation filter apparatus 4230, a data encoder 4635, and the signal processing apparatus 4640. The AD converter 20 is similar to the AD converter 20 shown in FIGS. 17 and 22, and converts an analog input signal into a digital input signal and supplies the result to the adaptive decimation filter apparatus 4230.

The adaptive decimation filter apparatus 4230 is similar to the adaptive decimation filter apparatus 4230 shown in FIG. 22. The adaptive decimation filter apparatus 4230 outputs a filter output signal (output signal) obtained by down-sampling the filter input signal (input signal). Here, the adaptive decimation filter apparatus 4230 performs adaptive decimation filter processing of using the filter characteristic adjusted by the signal processing apparatus 4640.

The data encoder 4635 is connected to the adaptive decimation filter apparatus 4230. The data encoder 4635 receives and encodes the output signal (filter output signal) and the filter/noise level information from the adaptive decimation filter apparatus 4230 to generate data addressed to the signal processing apparatus 4640.

The signal processing apparatus 4640 is connected to the data encoder 4635. The signal processing apparatus 4640 receives the data encoded by the data encoder 4635 and performs signal processing. The other points of the signal processing apparatus 4640 are similar to those of the signal processing apparatus 4240 shown in FIG. 22.

Figure 26:
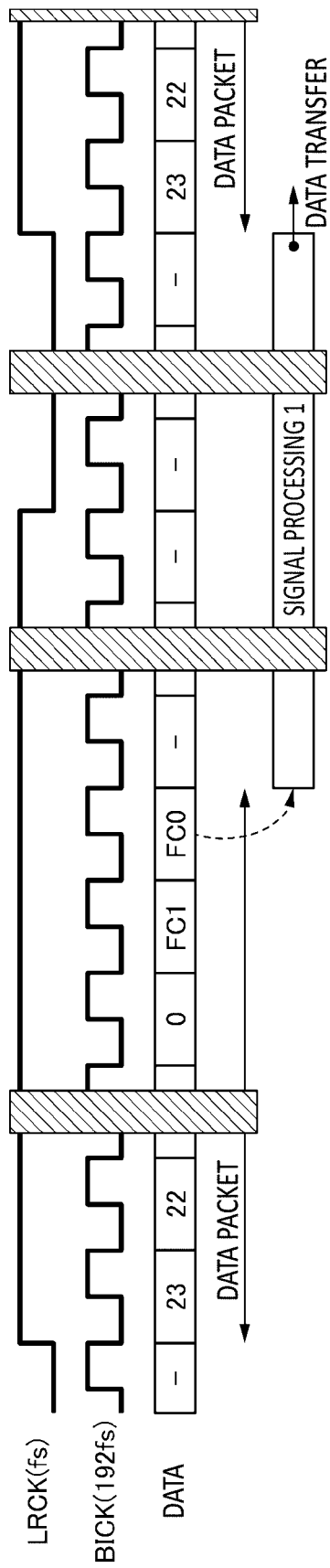
FIG. 26 shows a first example of data encoded by a data encoder 4635.

FIG. 26 shows a first example of the data encoded by the data encoder 4635. A sampling clock LRCK is a clock signal having the sampling frequency fs of the output signal of the adaptive decimation filter apparatus 4230 and the output of the signal processing apparatus 4640. A data transfer clock BICK is a clock to be used for data transfer from the data encoder 4635 to the signal processing apparatus 4640, and has a clock period corresponding to one cycle of data transfer. In the present embodiment, the sampling clock LRCK and the data transfer clock BICK are, as an example, a channel clock LRCK and an audio serial data clock BICK to be used for audio applications. Alternatively, the sampling clock LRCK and the data transfer clock BICK may be a sampling clock and a data transfer clock for another application.

In the example of this drawing, the data transfer clock BICK has a frequency 192 times that of the sampling clock LRCK. By making the data transfer clock BICK higher than the sampling clock LRCK, the transfer delay amount of the data output by the data encoder 4635 can be further reduced.

The data encoder 4635 starts data transfer processing for one sampling cycle in response to rising (alternatively, falling) of the sampling clock LRCK. In the data transfer processing, the data encoder 4635 outputs a data packet, which includes the output signal (24 bits of bit 23 to 0 in this drawing) and the FN code (2 bits of FN1 and FN0 in this drawing) of the adaptive decimation filter apparatus 4230, one bit per cycle of the data transfer clock BICK. Here, the data encoder 4635 outputs the data including the output signal and the FN code of the decimation filter 200 to the signal processing apparatus 4640 in the first half of the output cycle period (one cycle of the sampling clock LRCK) of the signal processing apparatus 4640 in order to further lengthen the time usable for the signal processing in the signal processing apparatus 4640. In the example of this drawing, the data encoder 4635 starts data transfer immediately after the start of the sampling cycle, and sequentially transmits the bits 23 to 0 of the output signal and the FN codes FN1 and FN0 bit by bit in synchronization with the data transfer clock BICK.

When receiving the data including the output signal and the FN code from the adaptive decimation filter apparatus 4230 via the data encoder 4635, the signal processing apparatus 4640 starts signal processing corresponding to the sampling cycle. In the example of this drawing, the signal processing apparatus 4640 performs signal processing within a sampling cycle in which the data packet is received, and outputs data of a signal processing result. That is, the signal processing apparatus 4640 inputs the output signal and the filter identification information of the decimation filter 200 within the output cycle period of the signal processing apparatus 4640, performs signal processing corresponding to the input output signal and filter identification information of the decimation filter 200, and outputs a signal generated by the signal processing.

According to the data encoder 4635 described above, the data packet including the output signal and the filter code of the adaptive decimation filter apparatus 4230 can be transmitted to the signal processing apparatus 4640 by using the data transfer clock BICK having a frequency higher than that of the sampling clock LRCK. Accordingly, the signal processing apparatus 4640 can perform some or all signal processing after receiving the data packet in the sampling cycle.

Figure 27:
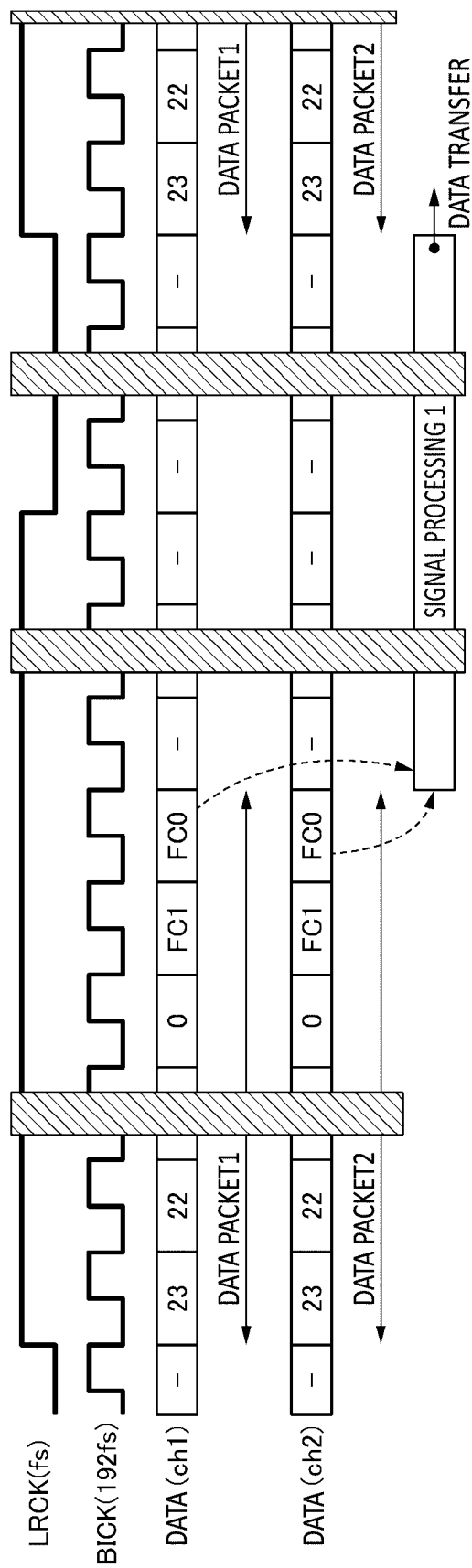
FIG. 27 shows a second example of the data encoded by the data encoder 4635.

FIG. 27 shows a second example of the data encoded by the data encoder 4635. In this drawing, the signal processing system 4200 inputs signals of a plurality of channels, performs signal processing, and outputs the signal processing results of the plurality of channels. In the example of this drawing, the AD converter 20 converts analog input signals of two channels into digital input signals of two channels. The adaptive decimation filter apparatus 4230 outputs output signals of a plurality of channels obtained by down-sampling the input signals of the plurality of channels from the AD converter 20. Here, the adaptive decimation filter apparatus 4230 performs adaptive decimation filter processing of using the filter characteristic adjusted by the signal processing apparatus 4640. The signal processing apparatus 4640 may set, to the decimation filter 200, different filter characteristics with respect to the input signals of the plurality of channels according to the characteristics of the respective input signals.

In the example of this drawing, the data encoder 4635 outputs data including the output signal and the filter/noise level information of the decimation filter 200 for each of the plurality of channels in a similar manner to that in FIG. 26. The data encoder 4635 outputs data packets for the plurality of channels in parallel by using data paths for the plurality of channels. When receiving the data packet of each of the plurality of channels, the signal processing apparatus 4640 performs signal processing on each of the plurality of channels similarly to FIG. 26 and outputs the signal processing result of each of the plurality of channels.

Figure 28:
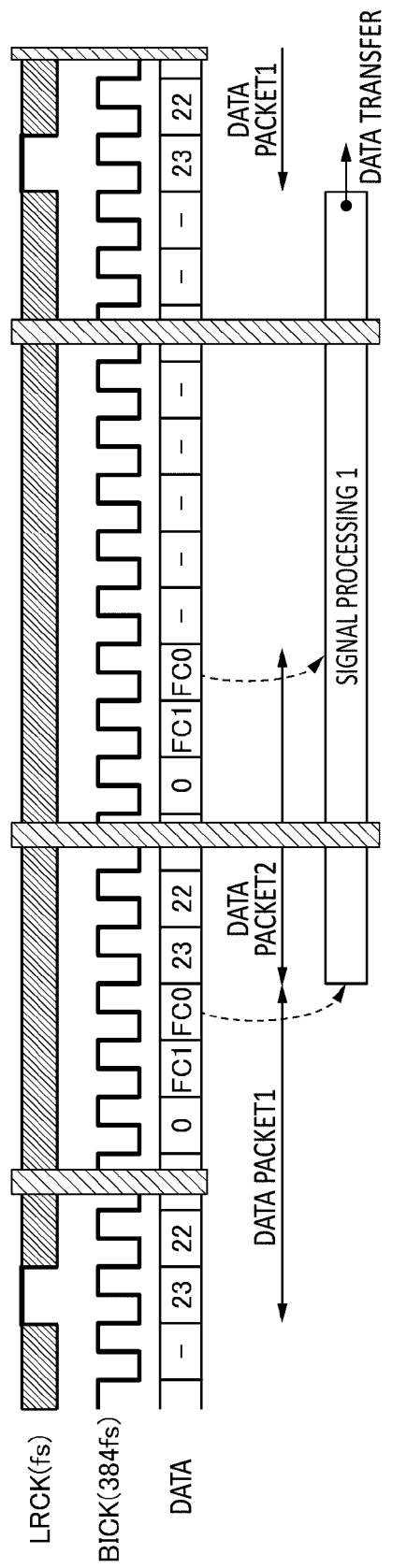
FIG. 28 shows a third example of the data encoded by the data encoder 4635.

FIG. 28 shows a third example of the data encoded by the data encoder 4635. Also in this drawing, the signal processing system 4600 inputs signals of a plurality of channels, performs signal processing, and outputs the signal processing results of the plurality of channels, similarly to FIG. 27. In the example of this drawing, the data encoder 4635 has a data path to be shared by a plurality of channels, and multiplexes data packets (data packets including the output signals and the FN codes of the decimation filter 200) for the plurality of channels during a sampling cycle to output the result to the signal processing apparatus 4640. Each time the signal processing apparatus 4640 receives the data packet of each channel, the signal processing apparatus may start signal processing of the channel. Alternatively, the signal processing apparatus 4640 may start signal processing for the plurality of channels after receiving the data packets of all channels. Note that, in the example of this drawing, the data transfer clock BICK has a frequency 384 times that of the sampling clock LRCK.

In FIGS. 26 to 28, when the clock of the output signal of the adaptive decimation filter apparatus 4230 is the sampling clock LRCK, the adaptive decimation filter apparatus 4230 has a delay of a magnitude, which is obtained by multiplying the sampling cycle of the input signal before decimation by one-half of the order of the decimation filter 200, from the input of the input signal at a certain time point to the output of the output signal affected by the relevant input signal. Therefore, the delay time from when the adaptive decimation filter apparatus 4230 inputs the input signal to when the signal processing apparatus 4640 outputs the signal processing result is a time obtained by adding the sampling cycle of the input signal x the order of the decimation filter 200/2 to the number of signal processing cycles of the signal processing apparatus 4640×the sampling cycle.

In the examples of FIGS. 26 to 28, the signal processing apparatus 4640 performs the signal processing, in which the output signal and the FN code included in the data packet received in each sampling cycle are reflected, within the sampling cycle, and outputs a signal processing result. That is, in the examples of FIGS. 26 to 28, the signal processing delay of the signal processing apparatus 4640 is equivalent to one cycle of the sampling cycle, and is constant regardless of the filter characteristic of the decimation filter 200.

For example, in noise canceling, the signal processing system 4600 outputs a noise canceling signal so as to deliver, to a target position, a noise canceling sound having a phase different from that of the noise sound by 180° in synchronization with timing at which the noise sound reaches the target position. In such real-time signal processing, even if the delay time of the signal processing system 4600 changes according to the filter characteristic of the decimation filter 200, the signal processing apparatus 4640 prevents the phase at the time point when the signal corresponding to the output signal of the signal processing system 4600 reaches the target from changing. In order to achieve this, the signal processing apparatus 4640 may cause the phases of the signals output by the respective filters 4400 to be different from each other so as to offset the change in phase corresponding to the delay time or the order of the decimation filter 200.

Figure 29:
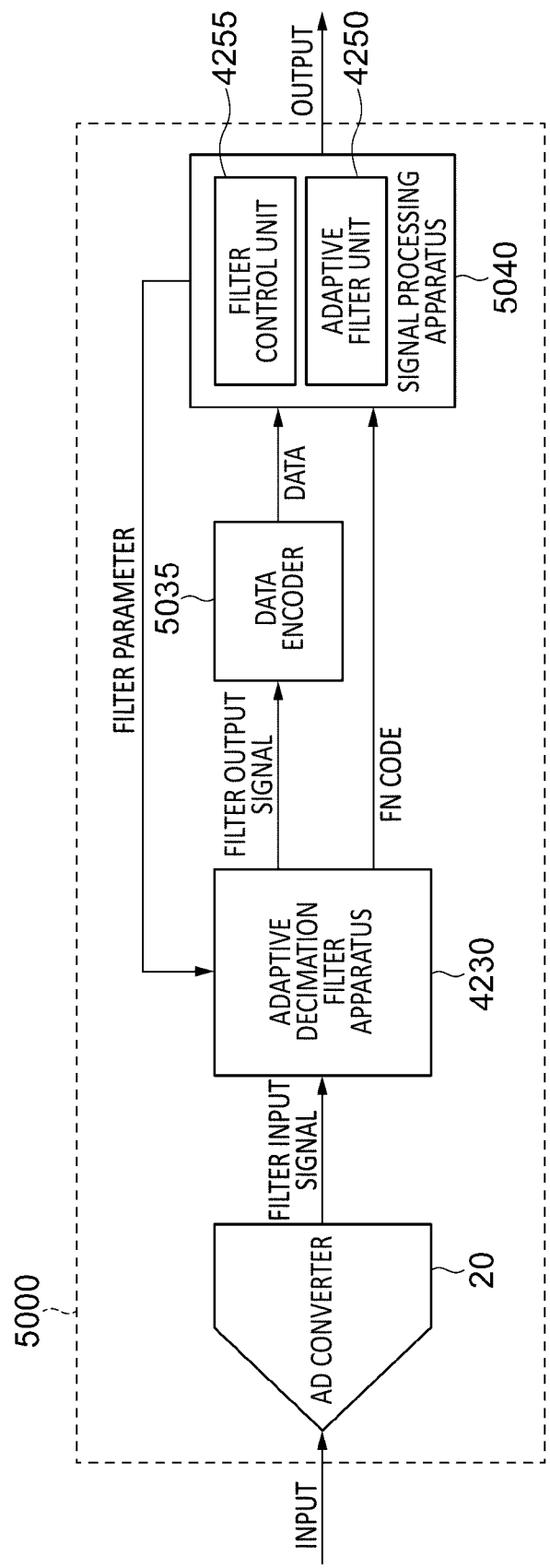
FIG. 29 shows a configuration of a signal processing system 5000 according to a ninth modification of the present embodiment.

FIG. 29 shows a configuration of a signal processing system 5000 according to a ninth modification of the present embodiment. Since the signal processing system 5000 is a modification of the signal processing system 1700 shown in FIGS. 17 to 21, the signal processing system 4200 shown in FIG. 22, and the signal processing system 4600 shown in FIG. 25, the description thereof will be omitted except for the following differences. In the signal processing system 5000, a data encoder 5035 corresponding to the data encoder 4635 in FIG. 25 encodes the output signal of the adaptive decimation filter apparatus 4230, but does not encode the FN code.

The signal processing system 5000 includes the AD converter 20, the adaptive decimation filter apparatus 4230, the data encoder 5035, and a signal processing apparatus 5040. The AD converter 20 and the adaptive decimation filter apparatus 4230 are similar to the AD converter 20 and the adaptive decimation filter apparatus 4230 shown in FIG. 25.

The data encoder 5035 is connected to the adaptive decimation filter apparatus 4230. The data encoder 5035 receives and encodes the output signal (filter output signal) from the adaptive decimation filter apparatus 4230 to generate data addressed to the signal processing apparatus 5040. The data encoder 5035 does not encode the filter/noise level information (FN code) from the adaptive decimation filter apparatus 4230.

The signal processing apparatus 5040 is connected to the adaptive decimation filter apparatus 4230 and the data encoder 5035. The signal processing apparatus 5040 receives the data encoded by the data encoder 5035 and the filter/noise level information output by the adaptive decimation filter apparatus 4230 and performs signal processing. The other points of the signal processing apparatus 5040 are similar to those of the signal processing apparatus 4240 shown in FIG. 22 and the signal processing apparatus 4640 shown in FIG. 25.

Figure 30:
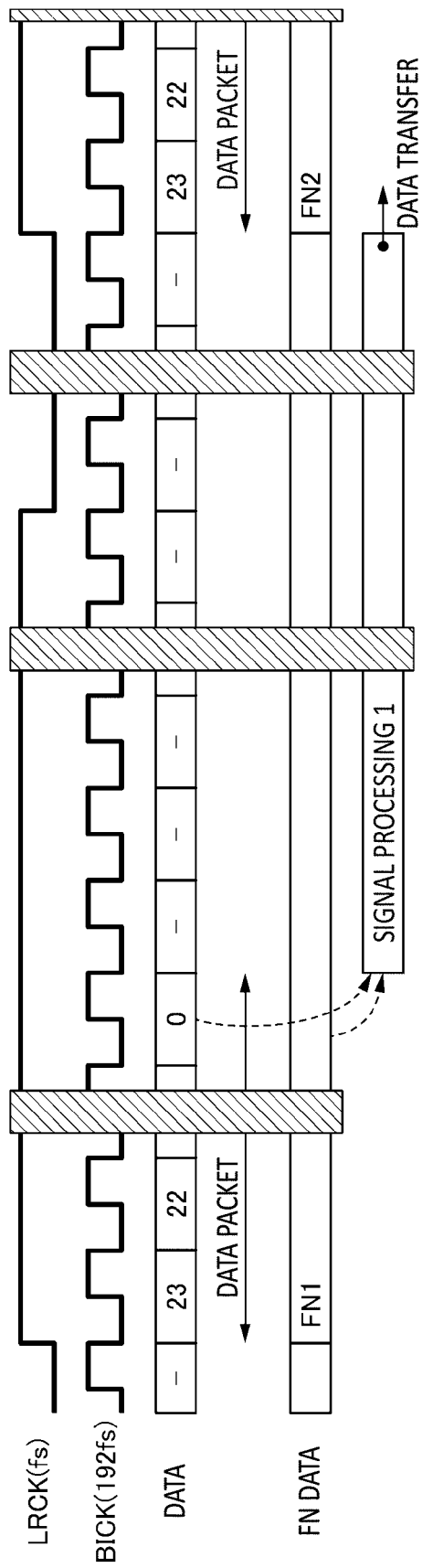
FIG. 30 shows a first example of data encoded by a data encoder 5035.

FIG. 30 shows a first example of the data encoded by the data encoder 5035. Since the example of this drawing is a modification of the data shown in FIG. 26, the description thereof will be omitted except for the following differences. In the example of this drawing, the adaptive decimation filter apparatus 4230 supplies the FN code to the signal processing apparatus 5040 without passing through the data encoder 5035 during the sampling cycle defined by the sampling clock LRCK.

The data encoder 5035 starts data transfer processing for one sampling cycle in response to rising (alternatively, falling) of the sampling clock LRCK. In the data transfer processing, the data encoder 5035 outputs a data packet, which includes the output signal (24 bits of bits 23 to 0 in this drawing) of the adaptive decimation filter apparatus 4230, one bit per cycle of the data transfer clock BICK. Here, the data encoder 5035 performs data transfer in the first half of one cycle of the sampling clock LRCK in order to further lengthen the time usable for the signal processing in the signal processing apparatus 5040. In the example of this drawing, the data encoder 5035 starts data transfer immediately after the start of the sampling cycle, and transmits the bits 23 to 0 of the output signal bit by bit in this order in synchronization with the data transfer clock BICK.

When receiving the FN code from the adaptive decimation filter apparatus 4230 and receiving the data including the output signal from the adaptive decimation filter apparatus 4230 via the data encoder 5035, the signal processing apparatus 5040 starts signal processing corresponding to the sampling cycle. In the example of this drawing, the signal processing apparatus 5040 performs signal processing within a sampling cycle in which the data packet is received, and outputs data of a signal processing result.

Figure 31:
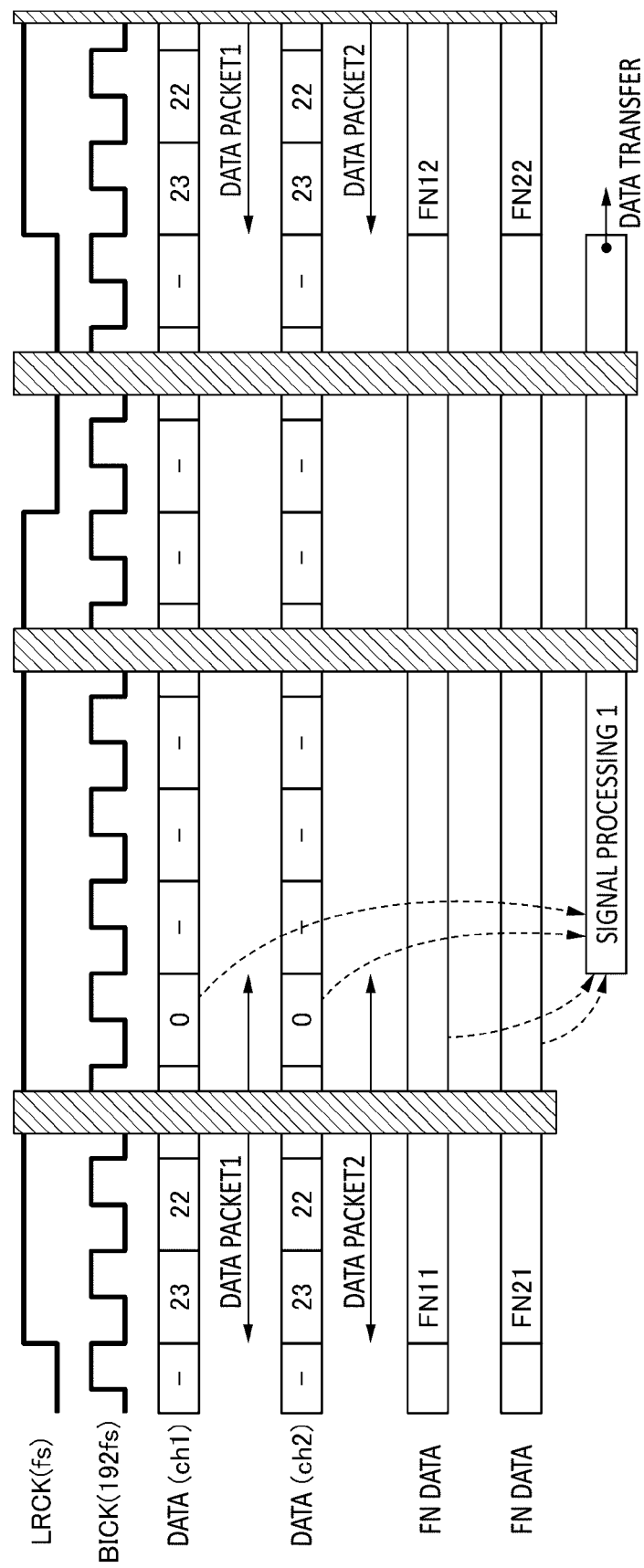
FIG. 31 shows a second example of the data encoded by the data encoder 5035.

FIG. 31 shows a second example of the data encoded by the data encoder 5035. Since the example of this drawing is a modification of the example shown in FIGS. 27 and 30, the description thereof will be omitted except for the following differences. In this drawing, the signal processing system 5000 inputs signals of a plurality of channels, performs signal processing, and outputs the signal processing results of the plurality of channels. In the example of this drawing, the AD converter 20 converts analog input signals of two channels into digital input signals of two channels. The adaptive decimation filter apparatus 4230 outputs output signals of a plurality of channels obtained by down-sampling the input signals of the plurality of channels from the AD converter 20. Here, the adaptive decimation filter apparatus 4230 performs adaptive decimation filter processing of using the filter characteristic adjusted by the signal processing apparatus 5040. The signal processing apparatus 5040 may set, to the decimation filter 200, different filter characteristics with respect to the input signals of the plurality of channels according to the characteristics of the respective input signals.

In the example of this drawing, the adaptive decimation filter apparatus 4230 supplies the FN code to the signal processing apparatus 5040 without passing through the data encoder 5035 for each of the plurality of channels. The data encoder 5035 outputs data including the output signal of the decimation filter 200 for each of the plurality of channels in a similar manner to that in FIG. 30. In the example of this drawing, the data encoder 5035 outputs data packets for the plurality of channels in parallel by using data paths for the plurality of channels. When receiving the FN code and the data packet of each of the plurality of channels, the signal processing apparatus 5040 performs signal processing on each of the plurality of channels similarly to FIGS. 27 and 30, and outputs the signal processing result of each of the plurality of channels.

Figure 32:
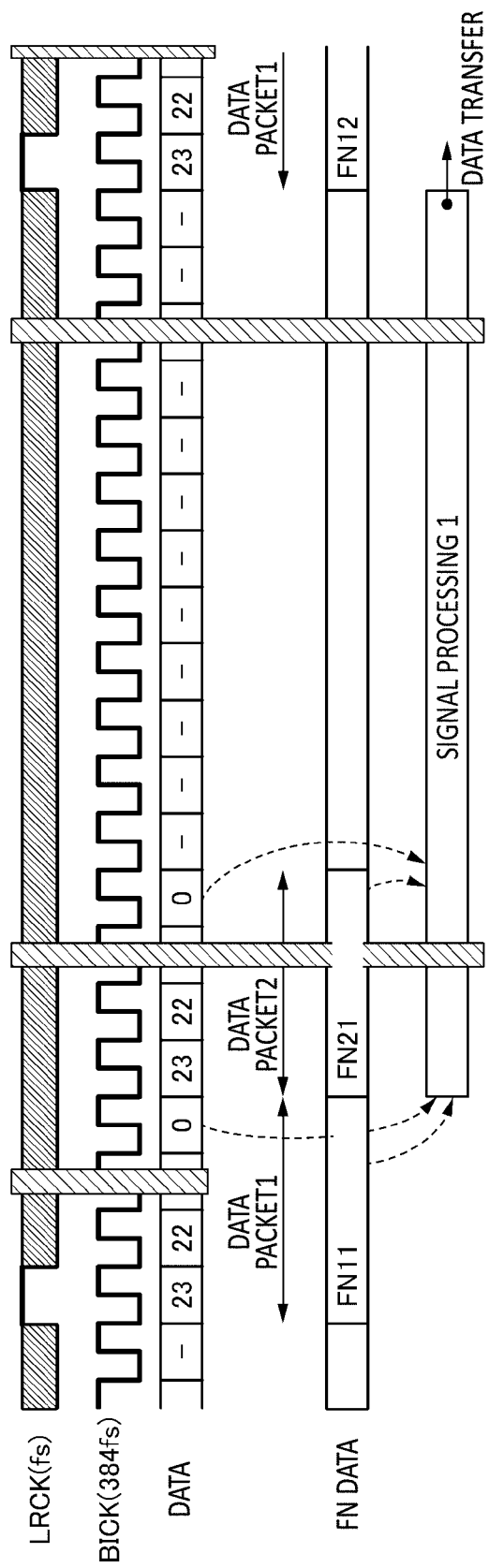
FIG. 32 shows a third example of the data encoded by the data encoder 5035.

FIG. 32 shows a third example of the data encoded by the data encoder 5035. Since the example of this drawing is a modification of the example shown in FIGS. 28 and 31, the description thereof will be omitted except for the following differences. Also in this drawing, the signal processing system 5000 inputs signals of a plurality of channels, performs signal processing, and outputs the signal processing results of the plurality of channels, similarly to FIG. 31. In the example of this drawing, the data encoder 5035 has a data path to be shared by a plurality of channels, and multiplexes data packets (data packets including the output signal of the decimation filter 200) for the plurality of channels during a sampling cycle, and outputs the result to the signal processing apparatus 5040. In addition, in the adaptive decimation filter apparatus 4230, a path for transmitting FN codes is shared by a plurality of channels, FN codes of the plurality of channels are multiplexed during a sampling cycle, and the result is output to the signal processing apparatus 5040 without passing through the data encoder 5035.

Figure 33:
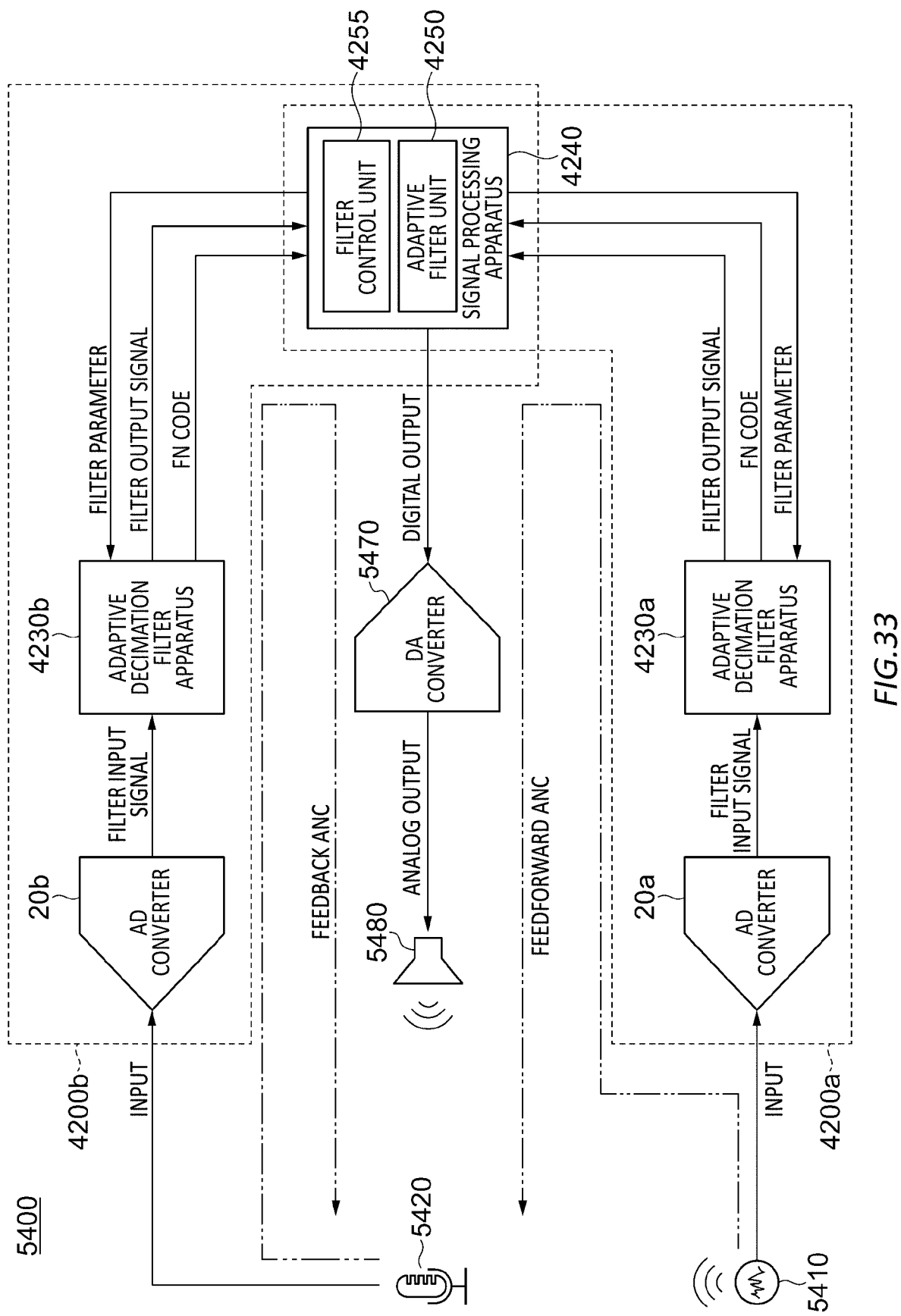
FIG. 33 shows a configuration of an ANC system 5400 according to a tenth modification of the present embodiment.

FIG. 33 shows a configuration of an ANC system 5400 according to a tenth modification of the present embodiment. The ANC system 5400 silences a noise sound at a certain target position. The ANC system 5400 uses both feedforward control and feedback control. The ANC system 5400 detects vibration or the like of the noise generation source by feedforward control, generates an anti-noise sound having an opposite phase to the noise sound until the noise sound reaches the target position, and transmits the anti-noise sound to the target position. The ANC system 5400 detects a noise sound at the target position by feedback control, generates an anti-noise sound which reduces the noise sound, and transmits the anti-noise sound to the target position.

The ANC system 5400 includes a sensor 5410, a signal processing system 4200a, a DA converter 5470, a speaker 5480, a microphone 5420, and a signal processing system 4200b. The sensor 5410, the signal processing system 4200a, the DA converter 5470, and the speaker 5480 are used for feedforward control. The microphone 5420, the signal processing system 4200b, the DA converter 5470, and the speaker 5480 are used for feedback control. The signal processing apparatus 4240 included in the signal processing system 4200a and the signal processing system 4200b, the DA converter 5470, and the speaker 5480 are shared by the feedforward control and the feedback control.

The sensor 5410 is installed in the vicinity of a noise generation source, such as an engine or a motor of a vehicle, which generates a noise sound. The sensor 5410 may be a sensor, such as an acceleration sensor or a rotation angle sensor, which detects the movement of a noise generation source which causes noise or may be a sensor, such as a microphone, which detects the noise sound generated by the noise generation source. The sensor 5410 supplies an analog signal including the detected noise component to the signal processing system 4200a.

The signal processing system 4200a is connected to the sensor 5410. In the present modification, the signal processing system 4200a is the signal processing system 4200 shown in FIG. 22. Instead of the signal processing system 4200a, the ANC system 5400 may use the signal processing system 1700 in FIG. 17, the signal processing system 4600 in FIG. 25, the signal processing system 5000 in FIG. 29, or modifications thereof. The signal processing system 4200a includes an AD converter 20a corresponding to the AD converter 20 of the signal processing system 4200, an adaptive decimation filter apparatus 4230a corresponding to the adaptive decimation filter apparatus 4230 of the signal processing system 4200, and the signal processing apparatus 4240 corresponding to the signal processing apparatus 4240 of the signal processing system 4200.

The AD converter 20a converts an analog signal including a noise component into a digital signal and supplies, as a filter input signal (input signal), the digital signal to the adaptive decimation filter apparatus 4230a. The adaptive decimation filter apparatus 4230a outputs a filter output signal (output signal) obtained when the filter input signal (input signal) is down-sampled by using the decimation filter 200 of which the filter characteristic has been adjusted by the signal processing apparatus 4240. In addition, the adaptive decimation filter apparatus 4230a detects the magnitude of aliasing noise which is folded back to a frequency lower than the Nyquist frequency in the output signal of the decimation filter 200 by down-sampling.

The signal processing apparatus 4240 receives the output signal of the adaptive decimation filter apparatus 4230a and the filter/noise level information from the adaptive decimation filter apparatus 4230a. The signal processing apparatus 4240 performs signal processing (noise canceling processing) corresponding to the filter identification information on the output signal of the decimation filter 200 in the adaptive decimation filter apparatus 4230a, and generates a noise canceling signal for reducing a noise component. The signal processing apparatus 4240 supplies, to the DA converter 5470, a digital output including the generated noise canceling signal. In addition, the signal processing apparatus 4240 adjusts the filter characteristic of the decimation filter 200 on the basis of at least one of the noise level information or the filter identification information.

The DA converter 5470 is connected to the signal processing apparatus 4240. The DA converter 5470 converts a digital output including the noise canceling signal from the signal processing apparatus 4240 into an analog output. The speaker 5480 is installed closer to the silencing target position than the sensor 5410. The speaker 5480 is connected to the DA converter 5470. The speaker 5480 generates an anti-noise sound corresponding to the noise canceling signal from the signal processing apparatus 4240 by converting the analog output into a sound.

Accordingly, in the feedforward control, the ANC system 5400 can change the filter characteristic of the decimation filter 200 according to the characteristic of the input signal including the noise component, and can adjust the order of the decimation filter 200 and the attenuation amount of the adjustment target component. Then, the ANC system 5400 can perform the adaptive filter processing corresponding to the filter characteristic of the decimation filter 200 in the signal processing apparatus 4240.

In the feedforward control, in accordance with the timing at which the noise sound reaches the target position from the noise generation source, the ANC system 5400 makes it possible to transmit, to the target position, an anti-noise sound of opposite phase having the same amplitude as that of the noise sound. For this purpose, the signal processing apparatus 4240 performs signal processing corresponding to the filter characteristic of the decimation filter 200 to change the phase of the noise canceling signal according to the change in the delay time of the decimation filter 200, thereby synchronizing the anti-noise sound with the noise sound at the target position.

In addition, by performing signal processing corresponding to the filter characteristic of the decimation filter 200, the signal processing apparatus 4240 can take more time for the signal processing to output a noise canceling signal with higher accuracy when the delay time of the decimation filter 200 is relatively short, and can use the signal processing with a shorter processing time to prevent the timing at which the anti-noise sound propagates to the target position from being delayed when the delay time of the decimation filter 200 is relatively long. Accordingly, the ANC system 5400 can realize suitable noise suppression in the entire decimation processing and noise canceling processing.

The microphone 5420 is provided in the vicinity of a target position where a noise sound is to be silenced. The microphone 5420 detects the noise sound at the target position and supplies an analog input signal including the detected noise component to the signal processing system 4200b. Here, the noise sound reaching the target position from the noise generation source is suppressed by the feedforward control. Therefore, the microphone 5420 detects a noise sound including a residue noise by the feedforward control and an environmental noise reaching the target position from a source other than the noise generation source in the vicinity of the sensor 5410.

The signal processing system 4200b is connected to the microphone 5420. In the present modification, the signal processing system 4200b is the signal processing system 4200 shown in FIG. 22. Instead of the signal processing system 4200b, the ANC system 5400 may use the signal processing system 1700 in FIG. 17, the signal processing system 4600 in FIG. 25, the signal processing system 5000 in FIG. 29, or modifications thereof. The signal processing system 4200b includes an AD converter 20b corresponding to the AD converter 20 of the signal processing system 4200, an adaptive decimation filter apparatus 4230b corresponding to the adaptive decimation filter apparatus 4230 of the signal processing system 4200, and the signal processing apparatus 4240 corresponding to the signal processing apparatus 4240 of the signal processing system 4200.

The AD converter 20b converts an analog signal including a noise component into a digital signal and supplies, as a filter input signal (input signal), the digital signal to the adaptive decimation filter apparatus 4230b. The adaptive decimation filter apparatus 4230b outputs a filter output signal (output signal) obtained when the filter input signal (input signal) is down-sampled by using the decimation filter 200 of which the filter characteristic has been adjusted by the signal processing apparatus 4240. In addition, the adaptive decimation filter apparatus 4230b detects the magnitude of aliasing noise which is folded back to a frequency lower than the Nyquist frequency in the output signal of the decimation filter 200 by down-sampling.

The signal processing apparatus 4240 receives the output signal of the adaptive decimation filter apparatus 4230b and the filter/noise level information from the adaptive decimation filter apparatus 4230b. The signal processing apparatus 4240 performs signal processing (noise canceling processing), which corresponds to the filter identification information for identifying the filter characteristic of the decimation filter 200, on the output signal of the decimation filter 200 in the adaptive decimation filter apparatus 4230b, and generates a noise canceling signal for reducing a noise component. The signal processing apparatus 4240 supplies, to the DA converter 5470, a digital output including the generated noise canceling signal. In addition, the signal processing apparatus 4240 adjusts the filter characteristic of the decimation filter 200 on the basis of the noise level information indicating the magnitude of aliasing noise and the filter identification information.

In the present modification, the signal processing apparatus 4240 is shared by the feedforward control and the feedback control. The signal processing apparatus 4240 may supply, to the DA converter 5470, a digital output including a noise canceling signal in which the noise canceling signal generated by the feedforward control and the noise canceling signal generated by the feedback control are superimposed.

The DA converter 5470 converts a digital output including the noise canceling signal from the signal processing apparatus 4240 into an analog output. The speaker 5480 generates an anti-noise sound corresponding to the noise canceling signal from the signal processing apparatus 4240 by converting the analog output into a sound.

Accordingly, in the feedback control, the ANC system 5400 can change the filter characteristic of the decimation filter 200 in the signal processing system 4200b according to the characteristic of the input signal including the noise component, and can adjust the order of the decimation filter 200 and the attenuation amount of the adjustment target component. Then, the ANC system 5400 can perform the adaptive filter processing corresponding to the filter characteristic of the decimation filter 200 in the signal processing apparatus 4240.

In the feedback control described above, the ANC system 5400 detects a noise sound including the residue noise at the target position and transmits, to the target position, an anti-noise sound for reducing the noise sound. The anti-noise sound is an anti-phase sound having ideally the same amplitude as that of the noise sound. However, there is a propagation delay in a feedback loop from the detection of the noise sound in the vicinity of the target position to the transmission of the anti-noise sound to the target position.

In the present modification, the signal processing apparatus 4240 can perform the adaptive filter processing corresponding to the change in the delay time of the decimation filter 200 by performing the signal processing corresponding to the filter characteristic of the decimation filter 200. Accordingly, when the delay time of the decimation filter 200 is relatively short, the signal processing apparatus 4240 can maintain the propagation delay of the entire feedback loop to be smaller, widen the bandwidth of the feedback loop, and enhance the followability with respect to the change in the environmental noise. In addition, when the delay time of the decimation filter 200 is relatively short, the signal processing apparatus 4240 can also take more time for the signal processing to output a noise canceling signal with higher accuracy. Accordingly, the ANC system 5400 can realize suitable noise suppression in the entire decimation processing and noise canceling processing.

Since the signal processing system 4200b is connected to the microphone 5420 which detects the noise sound at the target position, the output signal of the adaptive decimation filter apparatus 4230b is the residue noise itself at the target position where the noise sound is silenced. Using this, the signal processing apparatus 4240 may control the delay time of the adaptive decimation filter apparatus 4230a to be used for feedforward ANC on the basis of the output signal of the adaptive decimation filter apparatus 4230b. For example, the filter control unit 4255 in the signal processing apparatus 4240 adjusts the delay time of the adaptive decimation filter apparatus 4230a so as to reduce the residue noise at the target position to be silenced. Accordingly, the ANC system 5400 can improve phase adjustment accuracy between the noise sound at the silencing target position and the noise canceling signal, and can further reduce the residue noise and improve the noise canceling performance.

Figure 34:
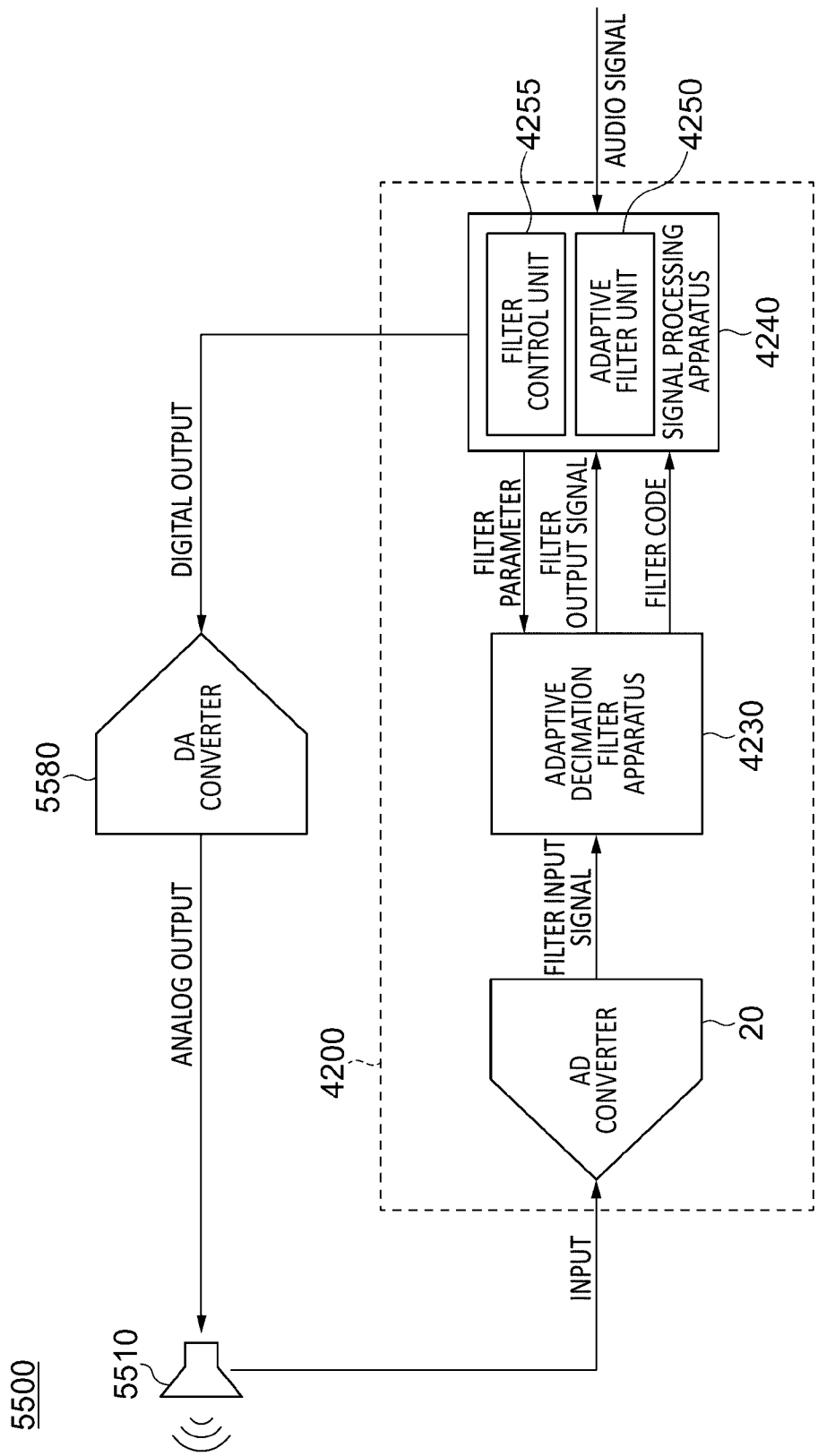
FIG. 34 shows a configuration of an MFB system 5500 according to an eleventh modification of the present embodiment.

FIG. 34 shows a configuration of an MFB system 5500 according to an eleventh modification of the present embodiment. The MFB system 5500 detects the movement of the diaphragm of a speaker apparatus 5510 and applies feedback to an audio signal to be supplied to the speaker apparatus 5510, thereby correcting the vibration of the diaphragm so as to have the same movement as that of the input audio signal. The MFB system 5500 includes the speaker apparatus 5510, the signal processing system 4200, and a DA converter 5580.

The speaker apparatus 5510 is a target of distortion correction by MFB. The speaker apparatus 5510 vibrates the diaphragm according to an analog signal input from the DA converter 5580 to generate sound. The speaker apparatus 5510 has a function of outputting a signal corresponding to vibration of the diaphragm to the signal processing system 4200. For example, the speaker apparatus 5510 converts the voltage of a signal current flowing through a speaker body by using a shunt resistor to generate a voltage corresponding to the movement of the diaphragm, and outputs the voltage to the signal processing system 4200. The speaker apparatus 5510 may detect the vibration of the diaphragm by using a displacement sensor installed on the diaphragm.

The signal processing system 4200 is connected to the speaker apparatus 5510. In the present modification, the signal processing system 4200 is the signal processing system 4200 shown in FIG. 22. Instead of the signal processing system 4200, the MFB system 5500 may use the signal processing system 1700 of FIG. 17, the signal processing system 4600 of FIG. 25, the signal processing system 5000 of FIG. 29, or modifications thereof. The signal processing system 4200 has the AD converter 20, the adaptive decimation filter apparatus 4230, and the signal processing apparatus 4240.

The AD converter 20 converts an analog signal corresponding to the vibration of the diaphragm into a digital signal and supplies, as a filter input signal (input signal), the digital signal to the adaptive decimation filter apparatus 4230. The adaptive decimation filter apparatus 4230 outputs a filter output signal (output signal) obtained when the filter input signal (input signal) is down-sampled by using the decimation filter 200 of which the filter characteristic has been adjusted by the signal processing apparatus 4240. In addition, the adaptive decimation filter apparatus 4230 detects the magnitude of aliasing noise which is folded back to a frequency lower than the Nyquist frequency in the output signal of the decimation filter 200 by down-sampling.

The signal processing apparatus 4240 receives the output signal of the adaptive decimation filter apparatus 4230 and the filter/noise level information from the adaptive decimation filter apparatus 4230. The signal processing apparatus 4240 performs signal processing, which corresponds to the filter identification information, on the output signal of the decimation filter 200 in the adaptive decimation filter apparatus 4230.

For example, the signal processing apparatus 4240 reproduces, from a signal corresponding to the vibration of the diaphragm, an audio signal corresponding to the relevant vibration by performing adaptive filter processing by the adaptive filter unit 4250 on the output signal of the decimation filter 200. The audio signal reproduced in this manner is an audio signal in which the distortion of the vibration of the diaphragm is reflected. The signal processing apparatus 4240 outputs, to the DA converter 5580, an audio signal obtained by applying distortion correction to an audio signal from an audio source so as to reduce or minimize an error between the audio signal input from the audio source and the reproduced audio signal. In addition, the signal processing apparatus 4240 adjusts the filter characteristic such as the order of the decimation filter 200 on the basis of the noise level information indicating the magnitude of aliasing noise and the filter identification information.

The DA converter 5580 is connected to the signal processing system 4200. The DA converter 5580 converts a digital signal, which is the distortion-corrected audio signal, into an analog signal and supplies the analog signal to the speaker apparatus 5510. The speaker apparatus 5510 vibrates the diaphragm by using the distortion-corrected audio signal.

In the present modification, the signal processing apparatus 4240 can perform the adaptive filter processing corresponding to the change in the delay time of the decimation filter 200 by performing the signal processing corresponding to the filter characteristic of the decimation filter 200. Accordingly, when the delay time of the decimation filter 200 is relatively short, the signal processing apparatus 4240 can maintain the propagation delay of the entire feedback loop to be smaller, widen the bandwidth of the feedback loop, and enhance the followability with respect to the change in the audio signal from the audio source. In addition, when the delay time of the decimation filter 200 is relatively short, the signal processing apparatus 4240 can also take more time for the signal processing to perform the distortion correction with higher accuracy. Accordingly, the MFB system 5500 can realize suitable MFB in the entire decimation processing and noise canceling processing.

Various embodiments of the present invention may be described with reference to flowcharts and block diagrams whose blocks may represent (1) stages of processes in which operations are performed or (2) sections of apparatuses responsible for performing operations. Certain stages and sections may be implemented by dedicated circuit, programmable circuit supplied with computer readable instructions stored on computer readable media, and/or processors supplied with computer readable instructions stored on computer readable media. Dedicated circuit may include digital and/or analog hardware circuits, and may include integrated circuits (IC) and/or discrete circuits. The programmable circuit may include a reconfigurable hardware circuit including logical AND, logical OR, logical XOR, logical NAND, logical NOR, and other logical operations, a memory element such as a flip-flop, a register, a field programmable gate array (FPGA) and a programmable logic array (PLA), and the like.

A computer readable medium may include any tangible device that can store instructions to be executed by a suitable device, and as a result, the computer readable medium having instructions stored thereon includes an article of manufacture including instructions which can be executed in order to create means for performing operations designated in the flowcharts or block diagrams. Examples of the computer readable medium may include an electronic storage medium, a magnetic storage medium, an optical storage medium, an electromagnetic storage medium, a semiconductor storage medium, and the like. More specific examples of the computer readable medium may include a floppy (registered trademark) disk, a diskette, a hard disk, a random access memory (RAM), a read-only memory (ROM), an erasable programmable read-only memory (EPROM or flash memory), an electrically erasable programmable read-only memory (EEPROM), a static random access memory (SRAM), a compact disc read-only memory (CD-ROM), a digital versatile disk (DVD), a Blu-ray (registered trademark) disk, a memory stick, an integrated circuit card, and the like.

The computer readable instructions may include source code or object code written in any combination of one or more programming languages, including assembler instructions, instruction-set-architecture (ISA) instructions, machine instructions, machine-dependent instructions, microcode, firmware instructions, state-setting data, or an object oriented programming language such as JAVA (registered trademark), C++, Smalltalk (registered trademark), or the like, and conventional procedural programming languages such as the "C" programming language or similar programming languages.

The computer readable instructions may be provided for a processor or programmable circuit of a general purpose computer, special purpose computer, or other programmable data processing apparatuses such as a computer locally or via a wide area network (WAN) such as a local area network (LAN), the Internet, or the like, and execute the computer readable instructions in order to create means for executing the operations designated in flowcharts or block diagrams. Examples of the processor include a computer processor, a processing unit, a microprocessor, a digital signal processor, a controller, a microcontroller, and the like.

Figure 36:
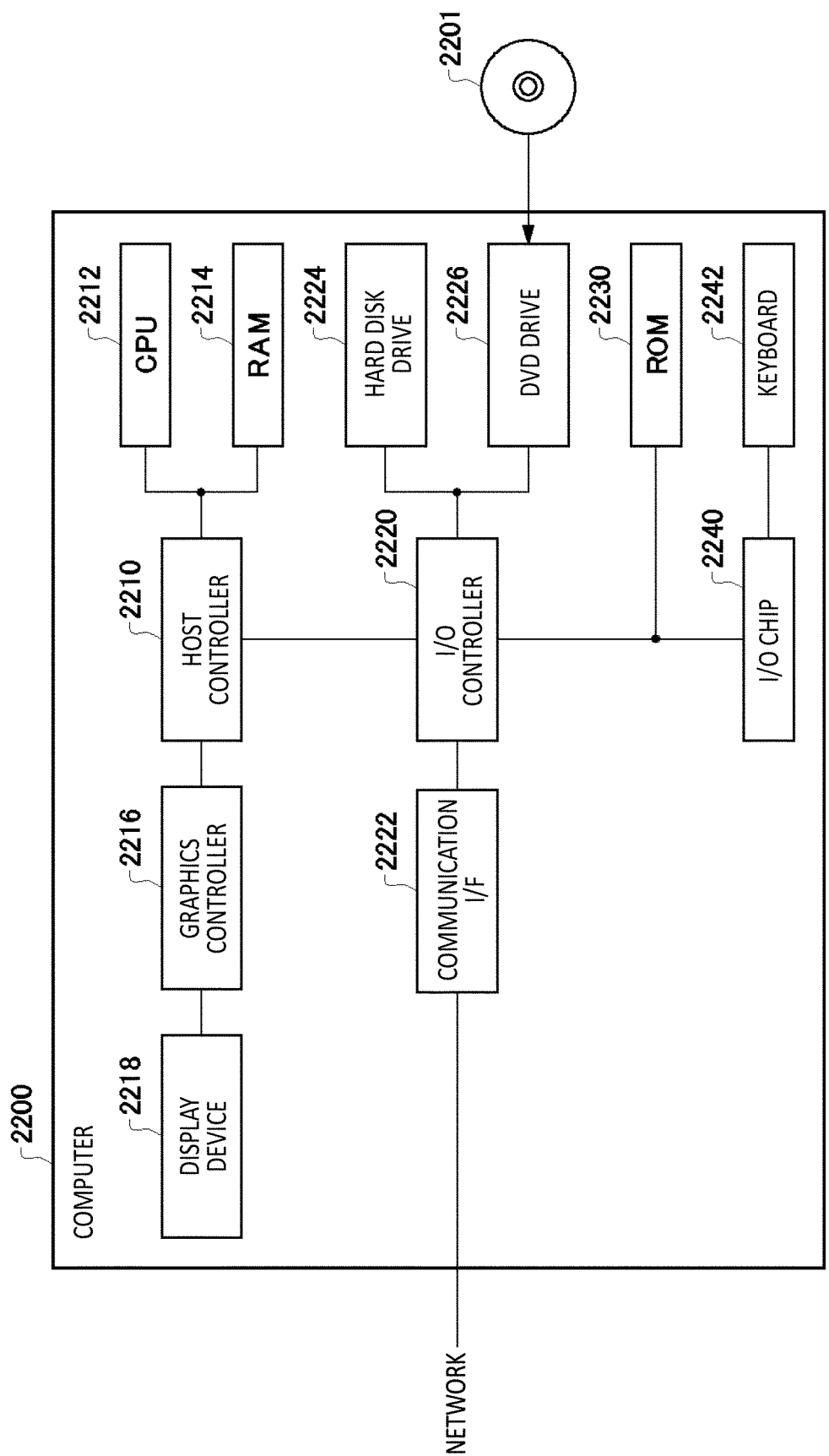
FIG. 36 shows an example of a computer 2200 in which a plurality of aspects of the present invention may be embodied in whole or in part.

FIG. 36 shows an example of a computer 2200 in which a plurality of aspects of the present invention may be embodied in whole or in part. A program installed in the computer 2200 may cause the computer 2200 to function as an operation associated with the apparatuses according to the embodiments of the present invention or as one or more sections of the apparatuses, or may cause the operation or the one or more sections to be executed, and/or may cause the computer 2200 to execute a process according to the embodiments of the present invention or a stage of the process. Such programs may be executed by a CPU 2212 in order to cause the computer 2200 to perform certain operations associated with some or all of the blocks in the flowcharts and block diagrams described in the present specification.

The computer 2200 according to the present embodiment includes the CPU 2212, a RAM 2214, a graphics controller 2216, and a display device 2218, which are mutually connected by a host controller 2210. The computer 2200 also includes input/output units such as a communication interface 2222, a hard disk drive 2224, a DVD-ROM drive 2226, and an IC card drive, which are connected to the host controller 2210 via an input/output controller 2220. The computer also includes legacy input/output units such as a ROM 2230 and a keyboard 2242, which are connected to the input/output controller 2220 via an input/output chip 2240.

The CPU 2212 operates according to programs stored in the ROM 2230 and the RAM 2214, thereby controlling each unit. The graphics controller 2216 obtains image data generated by the CPU 2212 on a frame buffer or the like provided in the RAM 2214 or in itself, and causes the image data to be displayed on the display device 2218.

The communication interface 2222 communicates with other electronic devices via a network. The hard disk drive 2224 stores programs and data used by the CPU 2212 in the computer 2200. The DVD-ROM drive 2226 reads the programs or the data from the DVD-ROM 2201, and provides the hard disk drive 2224 with the programs or the data via the RAM 2214. The IC card drive reads the programs and the data from the IC card, and/or writes the programs and the data to the IC card.

The ROM 2230 stores therein boot programs and the like executed by the computer 2200 at the time of activation, and/or programs that depend on the hardware of the computer 2200. The input/output chip 2240 may also connect various input/output units to the input/output controller 2220 via a parallel port, a serial port, a keyboard port, a mouse port, and the like.

The program is provided by a computer readable medium such as the DVD-ROM 2201 or the IC card. The program is read from a computer readable medium, installed in the hard disk drive 2224, the RAM 2214, or the ROM 2230 which are also examples of the computer readable medium, and executed by the CPU 2212. The information processing described in these programs is read by the computer 2200 and provides cooperation between the programs and the above-described various types of hardware resources. The apparatus or method may be configured by realizing operations or processing of information according to use of the computer 2200.

For example, in a case where communication is performed between the computer 2200 and an external device, the CPU 2212 may execute a communication program loaded in the RAM 2214 and instruct the communication interface 2222 to perform communication processing based on processing described in the communication program. Under the control of the CPU 2212, the communication interface 2222 reads transmission data stored in a transmission buffer processing region provided in a recording medium such as the RAM 2214, the hard disk drive 2224, the DVD-ROM 2201, or the IC card, transmits the read transmission data to the network, or writes reception data received from the network in a reception buffer processing region or the like provided on the recording medium.

In addition, the CPU 2212 may cause the RAM 2214 to read all or a necessary part of a file or database stored in an external recording medium such as the hard disk drive 2224, the DVD-ROM drive 2226 (DVD-ROM 2201), the IC card, or the like, and may execute various types of processing on data on the RAM 2214. Next, the CPU 2212 writes back the processed data to the external recording medium.

Various types of information such as various types of programs, data, tables, and databases may be stored in a recording medium and subjected to information processing. The CPU 2212 may execute various types of processing on the data read from the RAM 2214 to write back a result to the RAM 2214, the processing being described throughout the present disclosure, designated by instruction sequences of the programs, and including various types of operations, information processing, condition determinations, conditional branching, unconditional branching, information searches/replacements, or the like. In addition, the CPU 2212 may search for information in a file, a database, etc., in the recording medium. For example, when a plurality of entries, each having an attribute value of a first attribute associated with an attribute value of a second attribute, are stored in the recording medium, the CPU 2212 may search for an entry matching the condition whose attribute value of the first attribute is designated, from among the plurality of entries, and read the attribute value of the second attribute stored in the entry, thereby obtaining the attribute value of the second attribute associated with the first attribute satisfying the predetermined condition.

The programs or software modules described above may be stored in a computer readable medium on or near the computer 2200. In addition, a recording medium such as a hard disk or a RAM provided in a server system connected to a dedicated communication network or the Internet can be used as a computer readable medium, thereby providing a program to the computer 2200 via the network.

While the present invention has been described by way of the embodiments, the technical scope of the present invention is not limited to the above-described embodiments. It is apparent to persons skilled in the art that various alterations or improvements can be made to the above-described embodiments. It is also apparent from the description of the claims that embodiments added with such alterations or improvements can be included in the technical scope of the present invention.

The operations, procedures, steps, and stages of each process performed by an apparatus, system, program, and method illustrated in the claims, embodiments, or diagrams can be performed in any order as long as the order is not indicated by "prior to," "before," or the like and as long as the output from a previous process is not used in a later process. Even if the operation flow is described by using phrases such as "first" or "next" in the scope of the claims, specification, or drawings, it does not necessarily mean that the process must be performed in this order.

EXPLANATION OF REFERENCES

10: signal processing system;
20: AD converter;
20a to 20b: AD converter;
30: adaptive filter apparatus;
40: signal processing apparatus;

200: decimation filter;
210: filter control unit;
300-2 to N: delay element;
310-1 to N: thinning element;
320-1 to N: multiplier;
330-2 to N: adder;
340: filter coefficient storage unit;
350: selector;
400: signal;
410: aliasing;
500: first filter characteristic;
510: second filter characteristic;
620: noise detection unit;
660: filter characteristic determination unit;
730: HPF;
750: noise level output unit;
1020: noise detection unit;
1030: BPF;
1050: noise level output unit;
1110: filter control unit;
1140: signal detection unit;
1160: filter characteristic determination unit;
1230: LPF;
1250: signal level output unit;
1460: filter characteristic determination unit;
1470: threshold storage unit;
1480: comparison unit;
1490: decoding unit;
1560: filter characteristic determination unit;
1590: decoding unit;
1595: delay element;
1700: signal processing system;
1730: adaptive decimation filter apparatus;
1740: signal processing apparatus;
1810: aliasing noise detection unit;
1830: adaptive decimation filter;
1960: aliasing noise level determination unit;
2070: decoding unit;
2080: calculation unit;
4200: signal processing system;
4200a to 4200b: signal processing system;
4230: adaptive decimation filter apparatus;
4230a to 4230b: adaptive decimation filter apparatus;
4240: signal processing apparatus;
4250: adaptive filter unit;
4255: filter control unit;
4400-1 to 2: filter;
4410: selection unit;
4600: signal processing system;
4635: data encoder;
4640: signal processing apparatus;
5000: signal processing system;
5035: data encoder;
5040: signal processing apparatus;
5400: ANC system;
5410: sensor;
5420: microphone;
5470: DA converter;
5480: speaker;
5500: MFB system;
5510: speaker apparatus;
5580: DA converter;
2200: computer;
2201: DVD-ROM;
2210: host controller;
2212: CPU;
2214: RAM;
2216: graphics controller;
2218: display device;
2220: input/output controller;
2222: communication interface;
2224: hard disk drive;
2226: DVD-ROM drive;
2230: ROM;
2240: input/output chip; and
2242: keyboard.

What is claimed is:

1. A signal processing system comprising:
an adaptive decimation filter apparatus which has a decimation filter which outputs an output signal obtained by down-sampling an input signal, and an aliasing noise detection unit which detects a magnitude of aliasing noise, which is folded back to a frequency lower than a Nyquist frequency in the output signal of the decimation filter by the down-sampling, on a basis of a characteristic of the input signal and a characteristic of the decimation filter; and
a signal processing apparatus which has a filter control unit which adjusts an order of the decimation filter on a basis of the magnitude of the aliasing noise, and an adaptive filter unit which performs filter processing on the output signal of the decimation filter;
wherein the adaptive filter unit performs the filter processing corresponding to the order of the decimation filter or the characteristic of the decimation filter;
wherein the filter control unit adjusts a phase of the output signal according to adjustment of the order of the decimation filter.

2. The signal processing system according to claim 1, wherein
the aliasing noise detection unit further outputs filter identification information for identifying the order set in the decimation filter, and
the adaptive filter unit performs the filter processing corresponding to the filter identification information.

3. The signal processing system according to claim 1, wherein the adaptive filter unit performs the filter processing of offsetting a change in delay time of the decimation filter due to adjustment of the order.

4. The signal processing system according to claim 2, wherein the adaptive filter unit selects, according to the filter identification information, a filter which performs the filter processing of offsetting a change in delay time of the decimation filter due to adjustment of the order.

5. The signal processing system according to claim 2, wherein the filter control unit adjusts a phase of the output signal according to the filter identification information.

6. The signal processing system according to claim 1, further comprising an AD converter which converts the input signal in analog format into the input signal in digital format and supplies the input signal in digital format to the adaptive decimation filter apparatus.

7. The signal processing system according to claim 6, wherein
the AD converter converts the input signal in analog format including a noise component into the input signal in digital format, and
the adaptive filter unit performs the filter processing on the output signal of the decimation filter and generates a noise canceling signal for reducing the noise component.

8. The signal processing system according to claim 7, wherein the filter control unit adjusts the order of the decimation filter on a basis of the characteristic of the input signal so as to reduce the noise component included in the input signal.

9. The signal processing system according to claim 1, wherein
the aliasing noise detection unit has
a noise detection unit which detects a signal level of at least a part of frequencies, which are equal to or higher than the Nyquist frequency, in the input signal; and
an aliasing noise level determination unit which calculates the magnitude of the aliasing noise remaining in the output signal of the decimation filter when noise of the signal level detected by the noise detection unit is attenuated by the decimation filter of which the order has been adjusted.

10. The signal processing system according to claim 1, wherein the signal processing apparatus inputs the output signal of the decimation filter and noise level information indicating the magnitude of the aliasing noise, performs signal processing corresponding to the output signal of the decimation filter and the noise level information, which have been input, and the characteristic of the decimation filter, and outputs a signal generated by the signal processing within an output cycle period of the signal processing apparatus.

11. The signal processing system according to claim 2, wherein the signal processing apparatus inputs the output signal of the decimation filter, noise level information indicating the magnitude of the aliasing noise, and the filter identification information within an output cycle period of the signal processing apparatus, performs signal processing corresponding to the output signal of the decimation filter, the noise level information, and the filter identification information, which have been input, and outputs a signal generated by the signal processing.

12. A signal processing method comprising:
outputting, by a decimation filter of an adaptive decimation filter apparatus, an output signal obtained by down-sampling an input signal;
detecting, by an aliasing noise detection unit of the adaptive decimation filter apparatus, a magnitude of aliasing noise, which is folded back to a frequency lower than a Nyquist frequency in the output signal of the decimation filter by the down-sampling, on a basis of a characteristic of the input signal and a characteristic of the decimation filter;
adjusting, by a filter control unit of a signal processing apparatus, an order of the decimation filter on a basis of the magnitude of the aliasing noise; and
performing, by an adaptive filter unit of the signal processing apparatus, filter processing;
wherein the adaptive filter unit performs the filter processing corresponding to the order of the decimation filter or the characteristic of the decimation filter;
wherein the adaptive filter unit performs the filter processing of offsetting a change in delay time of the decimation filter due to adjustment of the order.

13. The signal processing method according to claim 12, wherein
the aliasing noise detection unit further outputs filter identification information for identifying the order set in the decimation filter, and
the adaptive filter unit performs the filter processing corresponding to the filter identification information.

14. A non-transitory computer readable medium having recorded thereon a signal processing program that, when executed by a computer, causes the computer to function as:
an adaptive decimation filter apparatus which has a decimation filter which outputs an output signal obtained by down-sampling an input signal, and an aliasing noise detection unit which detects a magnitude of aliasing noise, which is folded back to a frequency lower than a Nyquist frequency in the output signal of the decimation filter by the down-sampling, on a basis of a characteristic of the input signal and a characteristic of the decimation filter; and
a signal processing apparatus which has a filter control unit which adjusts an order of the decimation filter on a basis of the magnitude of the aliasing noise, and an adaptive filter unit which performs filter processing on the output signal of the decimation filter;
wherein the adaptive filter unit performs the filter processing corresponding to the order of the decimation filter or the characteristic of the decimation filter;
wherein the filter control unit adjusts a phase of the output signal according to adjustment of the order of the decimation filter.

15. The non-transitory computer readable medium according to claim 14, wherein
the aliasing noise detection unit further outputs filter identification information for identifying the order set in the decimation filter, and
the adaptive filter unit performs the filter processing corresponding to the filter identification information.

* * * * *